United States Patent

Nozaki

[11] Patent Number: 5,966,335
[45] Date of Patent: Oct. 12, 1999

[54] SEMICONDUCTOR MEMORY DEVICE HAVING CIRCUIT FOR CHANGING ELECTRICAL CHARACTERISTICS

[75] Inventor: Rieko Nozaki, Hyogo, Japan

[73] Assignee: Mitsubishi Denki Kabushiki Kaisha, Tokyo, Japan

[21] Appl. No.: 09/019,703

[22] Filed: Feb. 6, 1998

[30] Foreign Application Priority Data

Aug. 22, 1997 [JP] Japan .................................... 9-226185

[51] Int. Cl.⁶ .................................................. G11C 13/00
[52] U.S. Cl. ............................................ 365/200; 365/96
[58] Field of Search ........................ 365/96, 200, 189.01, 365/230.03

[56] References Cited

U.S. PATENT DOCUMENTS 5,687,125  11/1997  Kikuchi ................................. 365/200

FOREIGN PATENT DOCUMENTS 4-324652  11/1992  Japan .
5-72301   3/1993   Japan .

Primary Examiner—Terrell W. Fears
Attorney, Agent, or Firm—McDermott, Will & Emery

[57] ABSTRACT

In a semiconductor memory device, a characteristic changing circuit is connected with a signal line for transmitting an output control signal. If a fuse is normally blown, a fuse is blown together with a fuse for redundant replacement, and otherwise both fuses are not blown. If the fuse blowing is defective, the potential of a signal line is brought to a ground potential level based on a wafer test control signal. As a result, the output control signal is fixed at an L level, and the potential of a data input/output terminal is brought to a high impedance state.

15 Claims, 20 Drawing Sheets

SEMICONDUCTOR MEMORY DEVICE HAVING CIRCUIT FOR CHANGING ELECTRICAL CHARACTERISTICS

BACKGROUND OF THE INVENTION

1. Field of the Invention

The present invention relates generally to a semiconductor memory device having a circuit for changing electrical characteristics, and more particularly to a semiconductor memory device permitting the normality/abnormality of fuse blowing therein to be checked in the molded state.

2. Description of the Background Art

There have been semiconductor memory devices which permit adjustment of internal power supply potentials or replacement with redundant memory cells by blowing fuses.

An example of the configuration of such a conventional semiconductor memory device having a replaceable redundant circuit will be described.

A conventional semiconductor memory device 2000 shown in FIG. 20 includes a memory block #1, a redundant memory array #11, a main decode circuit 2, a redundant decode circuit 3, and a redundant comparator circuit 4.

Memory block #1 includes a plurality of memory cells (not shown) arranged at crossings of word lines and bit lines.

Main decode circuit 2 which selects a memory cell in memory block #1 has a column decode circuit and a row decode circuit.

Redundant memory array #11 has a plurality of redundant memory cells which are not shown. Redundant decode circuit 3 which selects a memory cell in redundant memory array #11 has a column decode circuit and a row decode circuit.

Redundant comparator circuit 4 controls main decode circuit 2 and redundant decode circuit 3 in order to replace a memory cell with a defect (hereinafter referred to as "defective cell") with a redundant memory cell.

In semiconductor memory device 2000, a defective cell found in memory cell block #1 during processing wafer is replaced with a redundant memory cell in the following procedure.

The address of the defective cell (hereinafter referred to as "defective address") is searched, and checked for the possibility of replacement with a redundant memory cell. If the defective address is replaceable, a polysilicon fuse portion corresponding to the defective address in redundant comparator circuit 4 is blown.

After this operation and the step of forming a protection film, only the products which have passed the final selection test are marketed.

Thus, if a defective cell is selected, redundant comparator circuit 4 controls main decode circuit 2 and redundant decode circuit 3 so that a replaced redundant memory cell is selected.

After the manufacture, in the process of analyzing or evaluating defects in semiconductor memory device 2000, it is critical to know if fuses are blown normally or abnormally. In the conventional semiconductor memory device 2000, the package should be opened for checking the normality/abnormality of the fuse blow using an electron microscope.

Furthermore, since it is not possible to determine if fuses are blown normally in the molded state, products with abnormally blown fuses may pass the final selection test to be marketed.

SUMMARY OF THE INVENTION

It is therefore an object of the invention to provide a semiconductor memory device permitting whether or not fuses are normally blown to be detected in the molded state.

A semiconductor memory device according to the invention permits defective cells to be replaced with redundant cells (hereinafter referred to as "redundant replacement") or adjustment of the internal power supply potential by blowing a first fuse, and includes an external connection terminal, a first signal line for transmitting a signal received from the external connection terminal or transmitting a signal to the external connection terminal, and a circuit for changing electrical characteristics of the first signal line based on the normality/abnormality of the blowing of the first fuse.

Therefore, a main advantage of the invention lies in that electrical characteristics of the external connection terminal may be changed based on the normality/abnormality of the blowing of the first fuse.

A semiconductor memory device according another aspect of the invention permits redundant replacement or adjustment of the internal power supply potential by blowing a first fuse, and includes an output control signal generation circuit for generating an output control signal to externally output a signal read out from a memory array, a first signal line for transmitting the output control signal, and a circuit for changing electrical characteristics of the first signal line based on the normality/abnormality of the blowing of the first fuse.

Therefore, another main advantage of the invention lies in that the state of the output control signal which controls output of data may be changed based on the normality/abnormality of fuse blowing and output data may be changed as a result.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
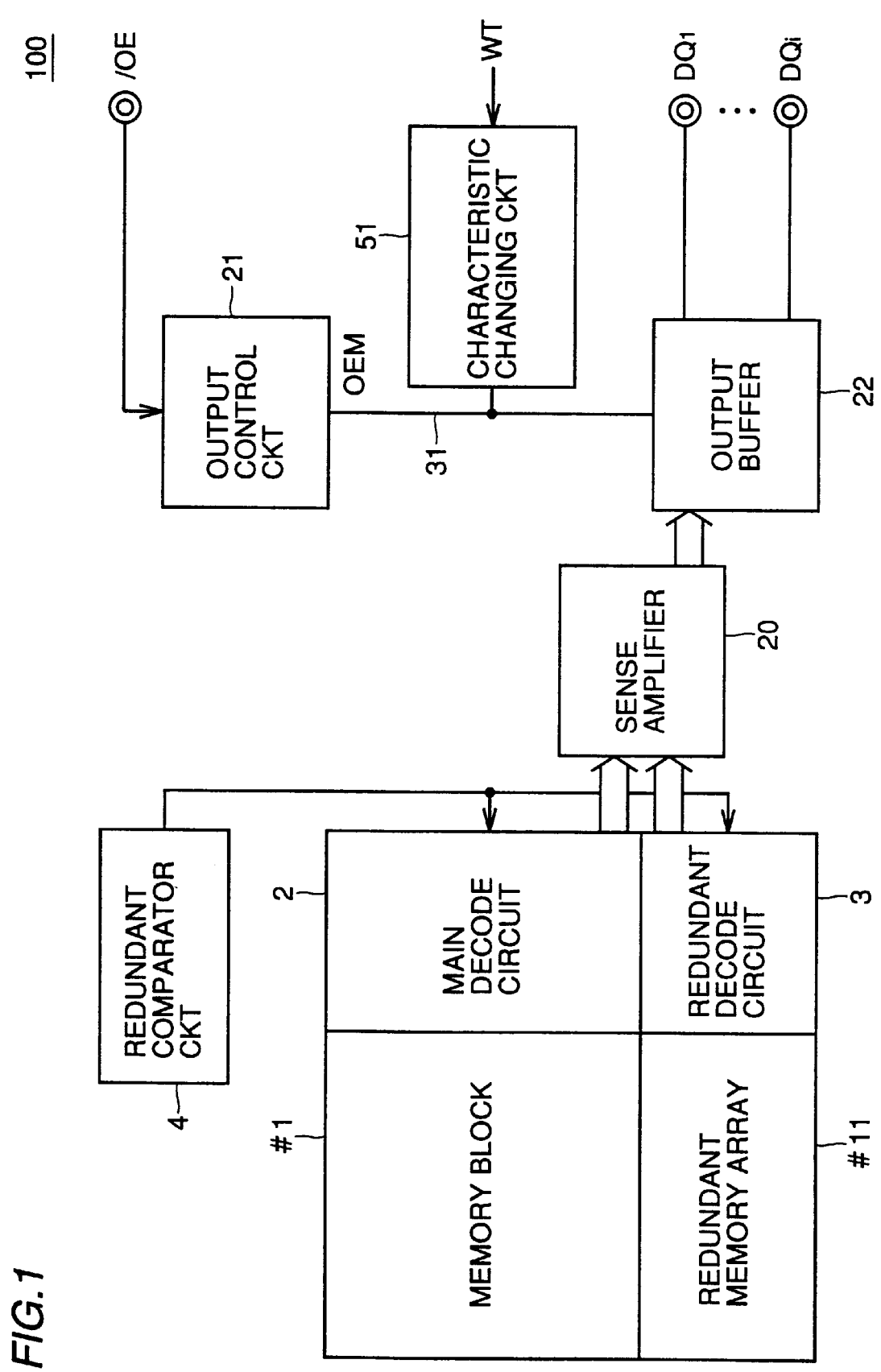
FIG. 1 is a block diagram showing a basic configuration of a semiconductor memory device 100 according to a first embodiment of the invention.

Preferred embodiments of the invention will be now described in conjunction with the accompanying drawings. The same elements are denoted by the same reference characters or symbols, and the description will not be repeated.

First Embodiment

A semiconductor memory device 100 according to a first embodiment of the invention will be described.

Semiconductor memory device 100 shown in FIG. 1 includes a memory block #1, a redundant memory array #11, a main decode circuit 2, a redundant decode circuit 3, a redundant comparator circuit 4, a sense amplifier 20, an output control circuit 21, an output buffer 22, and a characteristic changing circuit 51.

Sense amplifier 20 amplifies a signal read out from memory block #1 or redundant memory array #11.

Output control circuit 21 responds to an externally applied output enable signal /OE to output an H level or L level output control signal OEM. Output control signal OEM is transmitted to output buffer 22 through a signal line 31.

Output buffer 22 responds to output control signal OEM to output the signal received from sense amplifier 20 to corresponding data input/output terminals DQ1, ... , DQi (hereinafter generically referred to as "data input/output terminal DQ"). More specifically, if output control signal OEM is at an H level, the signal received from sense amplifier 20 is output to corresponding data input/output terminal DQ. If output control signal OEM is at an L level, the signal is not output to data input/output terminal DQ.

Characteristic changing circuit 51 according to the first embodiment is connected with signal line 31 which connects output control circuit 21 and output buffer 22.

Figure 2:
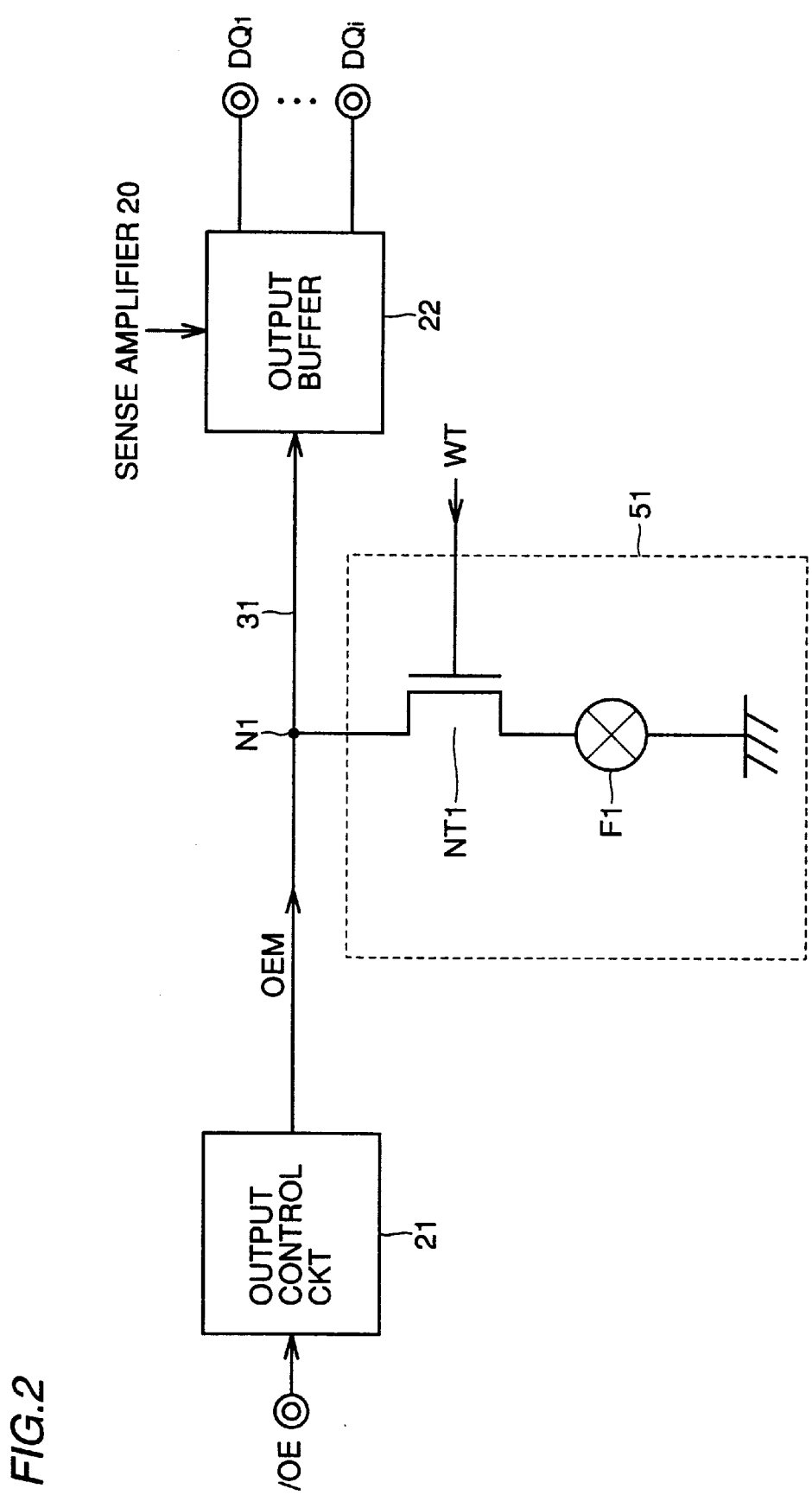
FIG. 2 is a circuit diagram showing the basic configuration of a characteristic changing circuit 51 according to the first embodiment.

The configuration of characteristic changing circuit 51 according to the first embodiment will be now described by referring to FIG. 2.

Characteristic changing circuit 51 shown in FIG. 2 includes a fuse F1 and an NMOS transistor NT1. NMOS transistor NT1 and fuse F1 are connected in series between a node N1 which is a connection node with signal line 31 and ground potential VSS.

Fuse F1 is a fuse equivalent to a fuse used for redundant replacement such as the fuse (not shown) included in redundant comparator 4. NMOS transistor NT1 receives at its gate electrode a wafer test control signal WT which controls wafer testing.

The operation of semiconductor memory device 100 according to the first embodiment shown in FIGS. 1 and 2 will be now described. In the step of testing a wafer according to the first embodiment, wafer test control signal WT at an L level to specify a wafer test is externally applied.

The step of testing a wafer with L level wafer test control signal WT will be described.

NMOS transistor NT1 in characteristic changing circuit 51 receives L level wafer test control signal WT at its gate electrode and attains a non-conductive state. Output control signal OEM is therefore directly transmitted to output buffer 22 through signal line 31.

Now, the case in which wafer test control signal WT is set to an H level as the device is in the molded state will be described.

Fuse F1 is a fuse equivalent to the one (not shown) included in redundant comparator circuit 4 used for replacement in redundant memory array #11. Therefore, if fuse blowing is normal, fuse F1 will be blown together with the fuse in redundant comparator circuit 4.

As a result, if a reading operation to semiconductor memory device 100 is performed (in other words if output control signal OEM is at an H level), the potential of data input/output terminal DQ attains an H level or an L level in response to the read out signal.

If the fuse in redundant comparator circuit 4 is defectively blown, fuse F1 is not blown either.

As a result, if a reading operation to semiconductor memory device 100 is performed, output control signal OEM is always at an L level, and data input/output terminal DQ continues to remain in a high impedance state.

More specifically, semiconductor memory device including characteristic changing circuit 51 according to the first embodiment can change electrical characteristics of the chip based on the normality/abnormality of the fuse blowing. Furthermore, the change in electrical characteristics may be monitored through a data input/output terminal. As a result, whether the fuse has been normally blown can be detected as the device is in the molded state.

Semiconductor memory device 100 according to the first embodiment is not limited to the configuration including a redundant memory array, and also any semiconductor memory device including an internal power supply potential generation circuit which adjusts the internal power supply potential by blowing a fuse may be used.

Second Embodiment

A semiconductor memory device 200 according to a second embodiment of the invention will be described.

Figure 3:
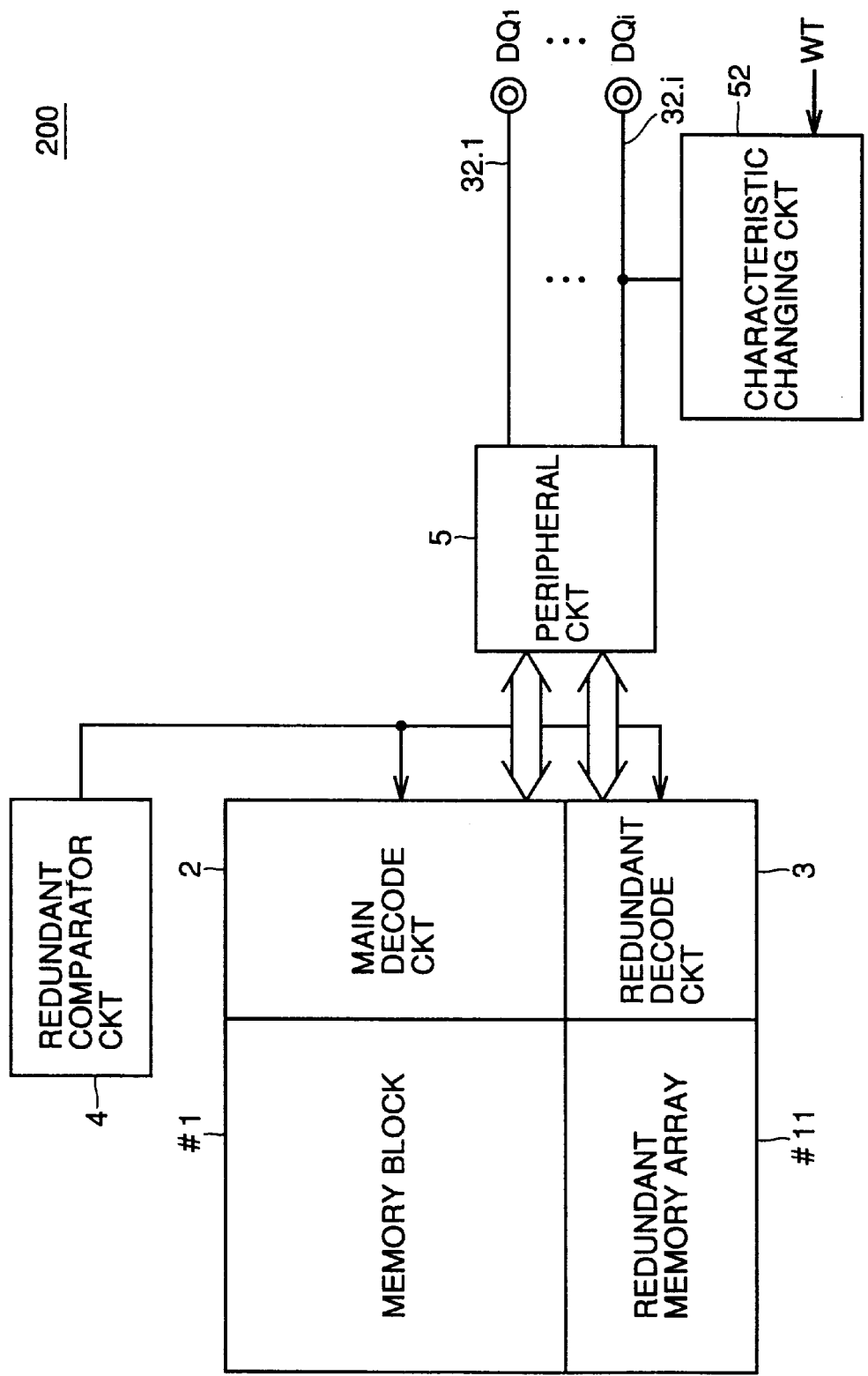
FIG. 3 is a block diagram showing a basic configuration of a semiconductor memory device 200 according to a second embodiment of the invention.

Semiconductor memory device 200 shown in FIG. 3 includes a memory block #1, a redundant memory array #11, a main decode circuit 2, a redundant decode circuit 3, a redundant comparator circuit 4, a peripheral circuit 5 and a characteristic changing circuit 52.

Peripheral circuit 5 includes a sense amplifier and the like which are not shown. Peripheral circuit 5 outputs a signal read out from memory block #1 or redundant memory array #11 onto I/O lines 32.1, . . . , 32.i (hereinafter generically referred to as "I/O line 32"). The potential of data input/output terminal DQ changes according to the potential of corresponding I/O line 32.

Characteristic changing circuit 52 according to the second embodiment is connected with I/O line 32.i which is connected with data input/output terminal DQi.

The configuration of characteristic changing circuit 52 according to the second embodiment will be now described.

Figure 4:
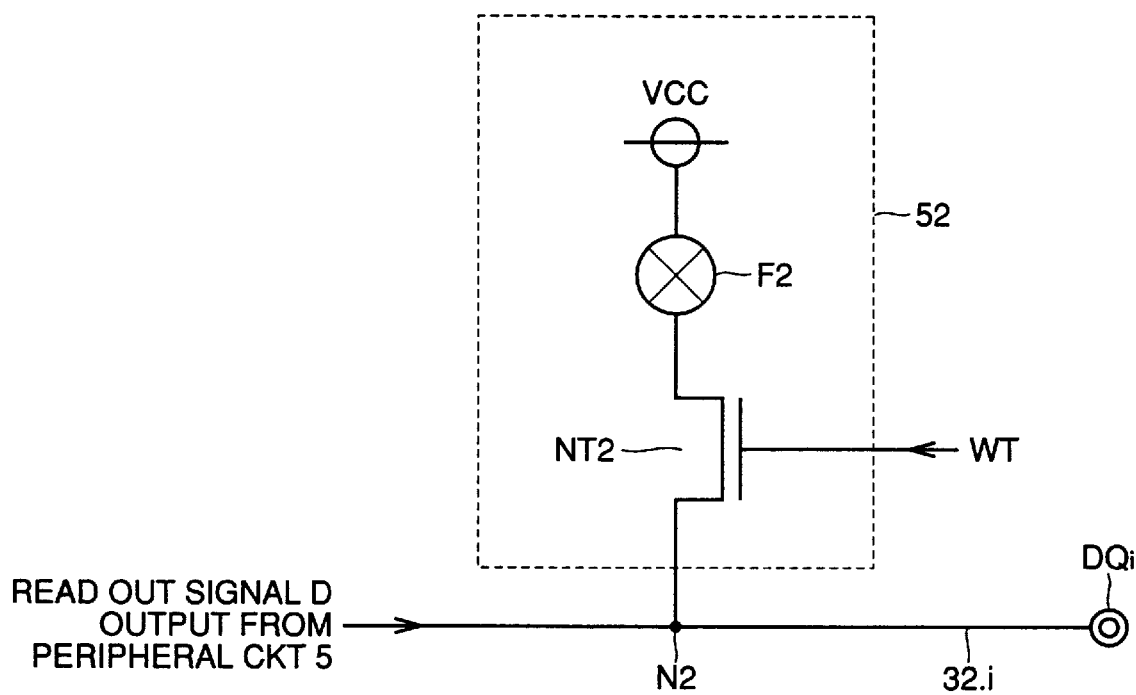
FIG. 4 is a circuit diagram showing the basic configuration of a characteristic changing circuit 52 according to the second embodiment.

FIG. 4 is a circuit diagram showing the basic configuration of characteristic changing circuit 52 according to the second embodiment. Characteristic changing circuit 52 shown in FIG. 4 includes a fuse F2 and an NMOS transistor NT2. Fuse F2 and NMOS transistor NT2 are connected in series between a node N2 which is a connection node with I/O line 32.i and an external power supply voltage VCC.

Fuse F2 is a fuse equivalent to the one used for redundant replacement (not shown) included in redundant comparator circuit 4. NMOS transistor NT2 receives, at its gate electrode, a wafer test control signal WT to control wafer testing.

The operation of semiconductor memory device 200 according to the second embodiment will be now described in conjunction with FIGS. 3 to 4. Assume that in the step of testing a wafer according to the second embodiment, wafer test control signal WT at an L level to specify a wafer test is externally applied.

The step of testing a wafer when wafer test control signal WT is at an L level will be now described.

The NMOS transistor NT2 of characteristic changing circuit 52 receives, at its gate electrode, the L level wafer test control signal WT and attains a non-conductive state.

The case in which wafer test control signal WT is set to an H level in the molded state will be now described.

If the fuse (not shown) for redundant replacement is normally blown, fuse F2 in characteristic changing circuit 52 is also blown, and external power supply voltage VCC and node N2 are disconnected. The potential of node N2 therefore does not change by the function of characteristic changing circuit 52.

As a result, if a reading operation to semiconductor memory device 200 is performed, the potential of input/output terminal DQi attains an H level or an L level in response to a read out signal D.

If the fuse blowing is defective, neither the fuse (not shown) for redundant replacement nor fuse F2 is blown. As a result, external power supply voltage VCC and node N2 are electrically connected, and the potential of I/O line 32.i is fixed at an H level by external power supply voltage Vcc. As a result, the potential of data input/output terminal DQi is always at an H level.

More specifically, in semiconductor memory device 200 including characteristic changing circuit 52 according to the second embodiment, the output signal of the data input/output terminal may be changed based on the normality/abnormality of the fuse blowing. As a result, whether a fuse has been normally blown can be detected in the molded state.

Semiconductor memory device 200 according to the second embodiment is not limited to the device including the redundant memory array, but also any semiconductor memory device including an internal power supply generation circuit which adjusts the internal power supply potential by blowing a fuse can be used.

Characteristic changing circuit 52 may be connected with I/O line 32 which is connected to any of data input/output terminals other than data input/output terminal DQi.

Third Embodiment

A semiconductor memory device 300 according to a third embodiment of the invention will be now described.

Figure 5:
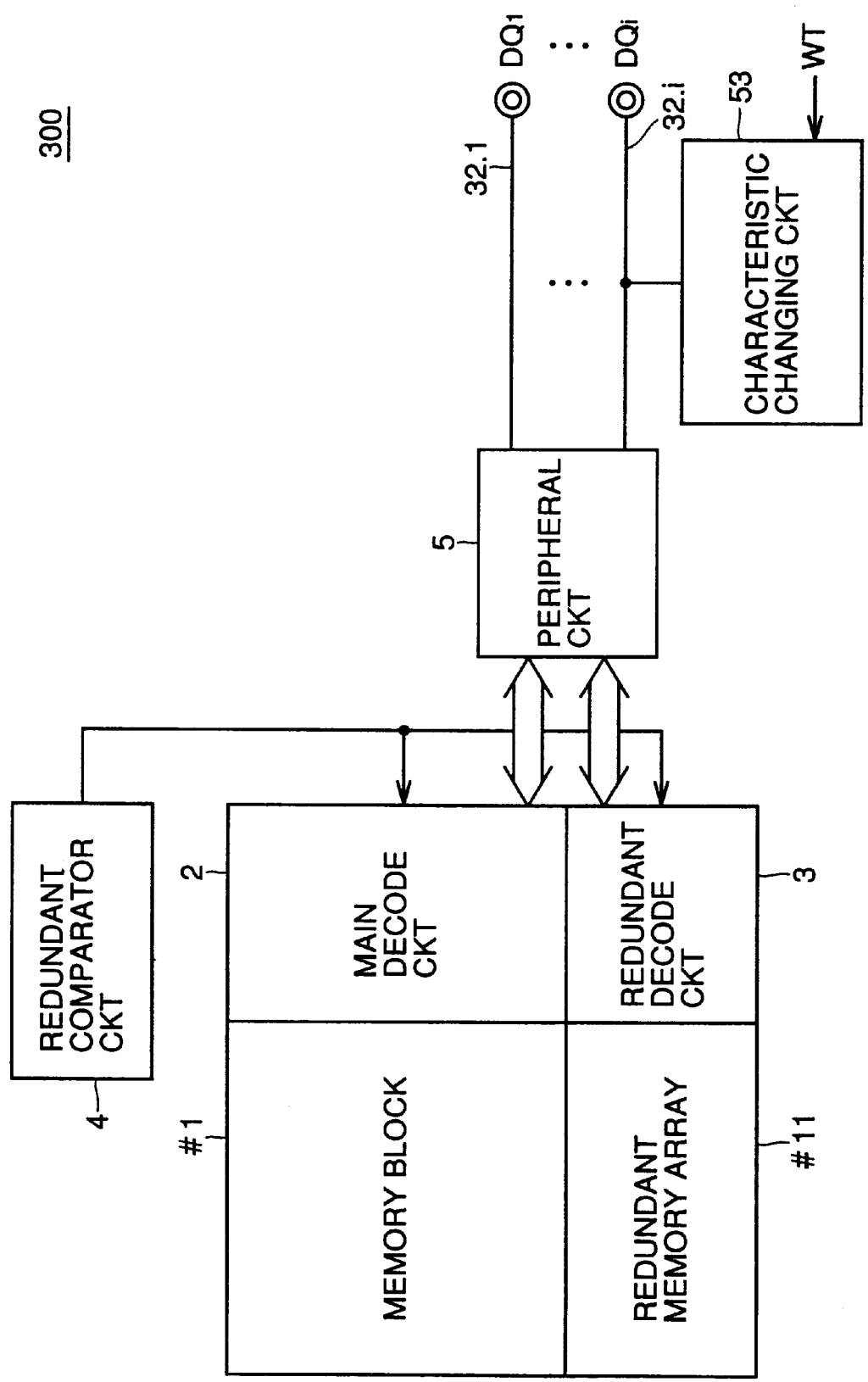
FIG. 5 is a block diagram showing a basic configuration of a semiconductor memory device 300 according to a third embodiment of the invention.

Semiconductor memory device 300 shown in FIG. 5 includes a memory block #1, a redundant memory array #11, a main decode circuit 2, a redundant decode circuit 3, a redundant comparator circuit 4, a peripheral circuit 5 and a characteristic changing circuit 53.

A signal read out from memory block #1 or redundant memory array #11 is output to data input/output terminal DQ through corresponding I/O line 32.

Characteristic changing circuit 53 according to the third embodiment is connected with I/O line 32.i which is connected with data input/output terminal DQi.

The configuration of characteristic changing circuit 53 according to the third embodiment will be now described.

Figure 6:
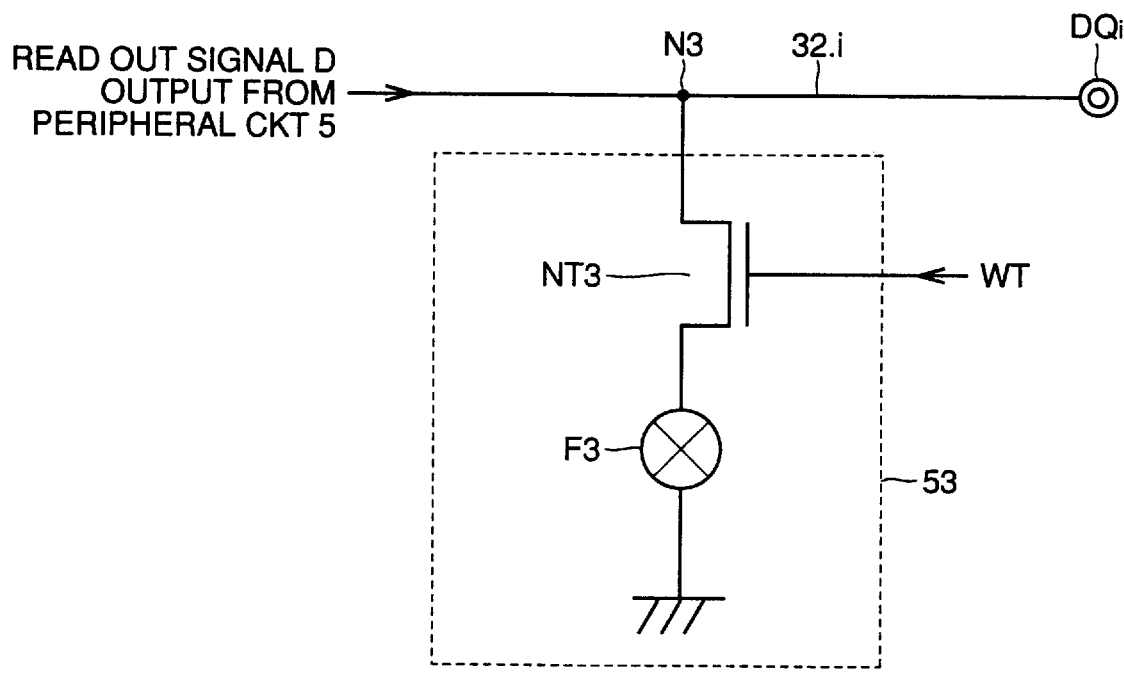
FIG. 6 is a circuit diagram showing the basic configuration of a characteristic changing circuit 53 according to the third embodiment.

FIG. 6 is a circuit diagram showing the basic configuration of characteristic changing circuit 53 according to the third embodiment. Characteristic changing circuit 53 shown in FIG. 6 includes a fuse F3 and an NMOS transistor NT3. Fuse F3 and NMOS transistor NT3 are connected in series between a node N3 which is a connection node with I/O line 32.i and a ground potential VSS.

Fuse F3 is a fuse equivalent to the one used for redundant replacement (not shown) included in redundant comparator circuit 4. NMOS transistor NT3 receives, at its gate electrode, a wafer test control signal WT which controls wafer testing.

The operation of semiconductor memory device 300 according to the third embodiment shown in FIGS. 5 and 6 will be now described. Assume that in the step of testing a wafer according to the third embodiment, wafer test control signal WT at an L level to specify wafer testing is externally applied.

The step of testing a wafer when wafer test control signal WT is at an L level will be described.

The NMOS transistor NT3 of characteristic changing circuit 53 receives at its gate electrode wafer test control signal WT at an L level and attains a non-conductive state.

The case in which wafer test control signal WT is set to an H level in the molded state will be now described.

If the fuse blowing is normal, the fuse (not shown) for redundant replacement is blown together with fuse F3 in characteristic changing circuit 53, and node N3 and ground potential VSS are disconnected. The potential of node N3 therefore does not change by the function of characteristic changing circuit 53.

As a result, if a reading operation to semiconductor memory device 300 is performed, the potential of data input/output terminal DQi attains an H level or an L level in response to a read out signal D.

If the fuse blowing is defective, not only the fuse (not shown) for redundant replacement but also fuse F3 is not blown. Node N3 and ground potential VSS are electrically connected. The potential of I/O line 32.i is therefore fixed at an L level by ground potential VSS. As a result, the potential of data input/output terminal DQi is always at an L level.

More specifically, in semiconductor memory device 300 including characteristic changing circuit 53 according to the third embodiment, the output signal of the data input/output terminal can be changed based on the normality/abnormality of the fuse blowing. As a result, whether or not a fuse has been normally blown can be detected in the molded state.

Semiconductor memory device 300 according to the third embodiment is not limited to the device including a redundant memory array, but for example any semiconductor memory device including an internal power supply potential generation circuit which adjusts the internal power supply potential by blowing a fuse can be used.

Characteristic changing circuit 53 may be connected with I/O line 32 which is connected with a data input/output terminal other than data input/output terminal DQi.

Fourth Embodiment

A semiconductor memory device 400 according to a fourth embodiment of the invention will be described.

Figure 7:
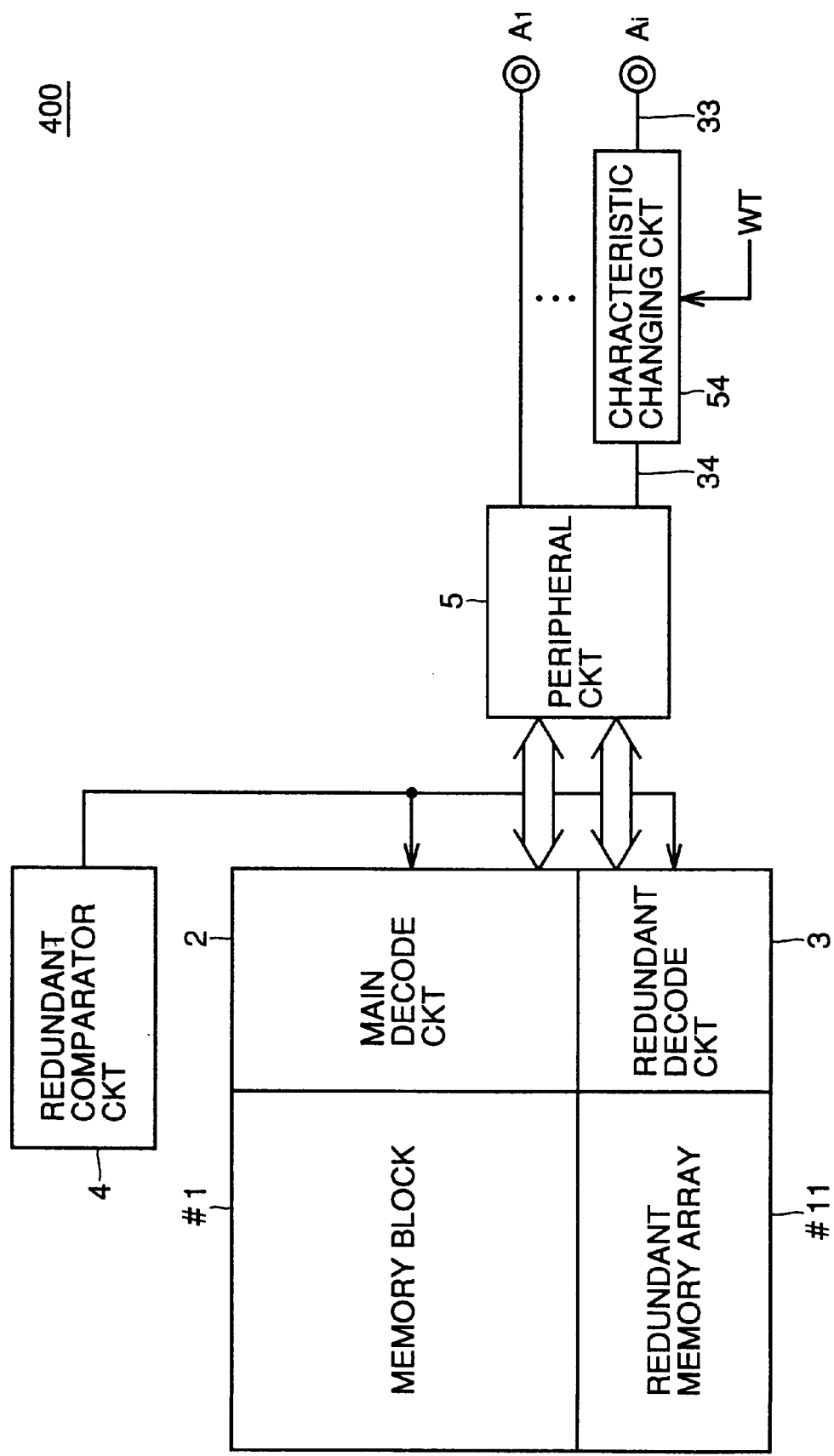
FIG. 7 is a block diagram showing a basic configuration of a semiconductor memory device 400 according to a fourth embodiment of the invention.

Semiconductor memory device 400 shown in FIG. 7 includes a memory block #1, a redundant memory array #11, a main decode circuit 2, a redundant decode circuit 3, a redundant comparator circuit 4, a peripheral circuit 5, and a characteristic changing circuit 54.

Peripheral circuit 5 is connected with external connection terminals A1, . . . , Ai.

Characteristic changing circuit 54 according to the fourth embodiment is connected with any one of external connection terminals (Ai in FIG. 7) by a signal line 33. Characteristic changing circuit 54 is connected with peripheral circuit 5 by a signal line 34.

The configuration of characteristic changing circuit 54 according to the fourth embodiment will be now described.

Figure 8:
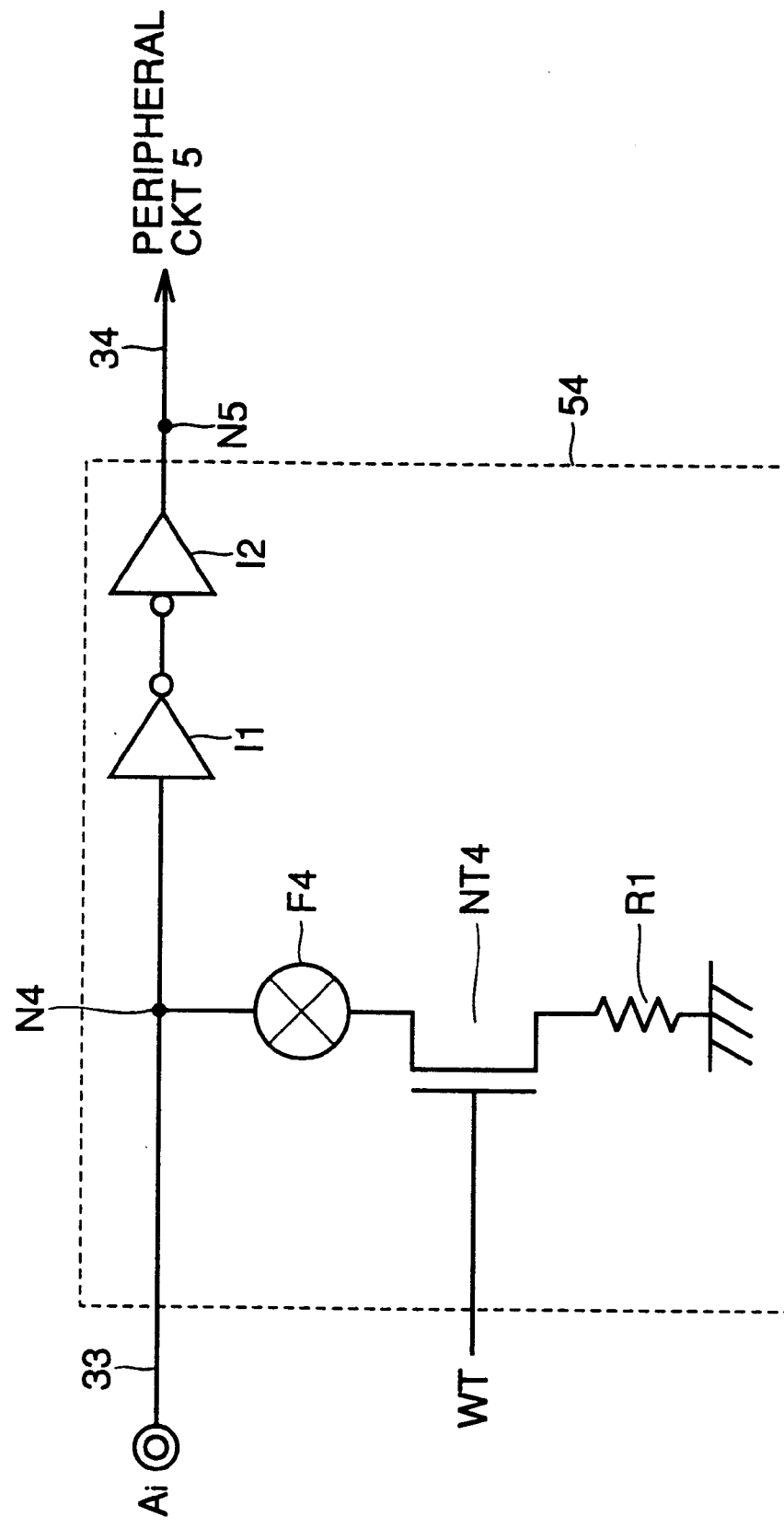
FIG. 8 is a circuit diagram showing the basic configuration of a characteristic changing circuit 54 according to the fourth embodiment.

FIG. 8 is a circuit diagram showing the basic configuration of characteristic changing circuit 54 according to the fourth embodiment. Characteristic changing circuit 54 shown in FIG. 8 includes a fuse F4, an NMOS transistor NT4, a resistor R1, and inverter circuits I1 and I2.

Fuse F4, NMOS transistor NT4 and resistor R1 are connected in series between a node N4 which is a node connecting signal line 33 and characteristic changing circuit 54, and a ground potential VSS. External connection terminal Ai is connected with signal line 33.

Inverter circuits I1 and I2 are connected in series between node N4 and a node N5 which is a node connecting characteristic changing circuit 54 and signal line 34. Signal line 34 is connected with peripheral circuit 5.

Fuse F4 is a fuse equivalent to the one used for redundant replacement (not shown) included in redundant comparator circuit 4. NMOS transistor NT4 receives, at its gate electrode, a wafer test control signal WT which controls wafer testing.

The operation of semiconductor memory device 400 shown in FIGS. 7 and 8 according to the fourth embodiment will be now described.

The step of testing a wafer when wafer test control signal WT is at an L level will be now described.

The NMOS transistor NT4 of characteristic changing circuit 54 receives, at its gate electrode, wafer test control signal WT at an L level and attains a non-conductive state.

The case in which wafer test control signal WT is set to an H level in the molded state will be described. If the fuse blowing is normal, fuse F4 in characteristic changing circuit 54 is blown together with the fuse (which is not shown) for redundant replacement, and node N4 and resistor R1 are disconnected. The potential of node N4 therefore does not change by characteristic changing circuit 54.

If the fuse blowing is defective, neither the fuse (not shown) for redundant replacement nor fuse F4 is blown. Therefore, node N4 and resistor R1 are electrically connected.

Herein, a current I0 (or voltage) for testing is applied from external connection terminal Ai to perform an IF testing to check changes in the potential and current of external connection terminal Ai.

If the fuse blowing is defective, current I0 is passed across resistor R1 through signal line 33 from node N4. The potential of node N4 attains an intermediate potential between the H level and the L level. Thus, a through current is generated in inverter circuits I1 and I2. As a result, the current value (or voltage value) detected at external connection terminal Ai exceeds a prescribed specified value.

If the fuse blowing is normal, the potential of node N4 attains an H level or an L level. A through current is not generated in inverter circuits I1 and I2. Therefore, the current value (or the voltage value) detected at external connection terminal Ai is within the range for a prescribed specified value.

More specifically, in semiconductor memory device 400 including characteristic changing circuit 54 according to the fourth embodiment, the current value or voltage value measured at the external connection terminal can be changed based on the normality/abnormality of the fuse blowing. As a result, whether a fuse has been normally blown can be detected in the molded state.

Semiconductor memory device 400 according to the fourth embodiment is not limited to the device including a redundant memory array, but also any semiconductor device including an internal power supply potential generation circuit which adjusts the internal power supply potential by blowing fuses may be used.

If semiconductor memory device 400 is additionally provided with a circuit (signal generation circuit 7 which will be described) to output a particular test signal in response to an address signal, for example, and NMOS transistor NT4 is turned on in response to wafer test control signal WT and that particular test signal, whether or not a fuse is blown can be detected in a test mode corresponding to the particular test signal.

Fifth Embodiment

A semiconductor memory device 500 according to a fifth embodiment of the invention will be described.

Figure 9:
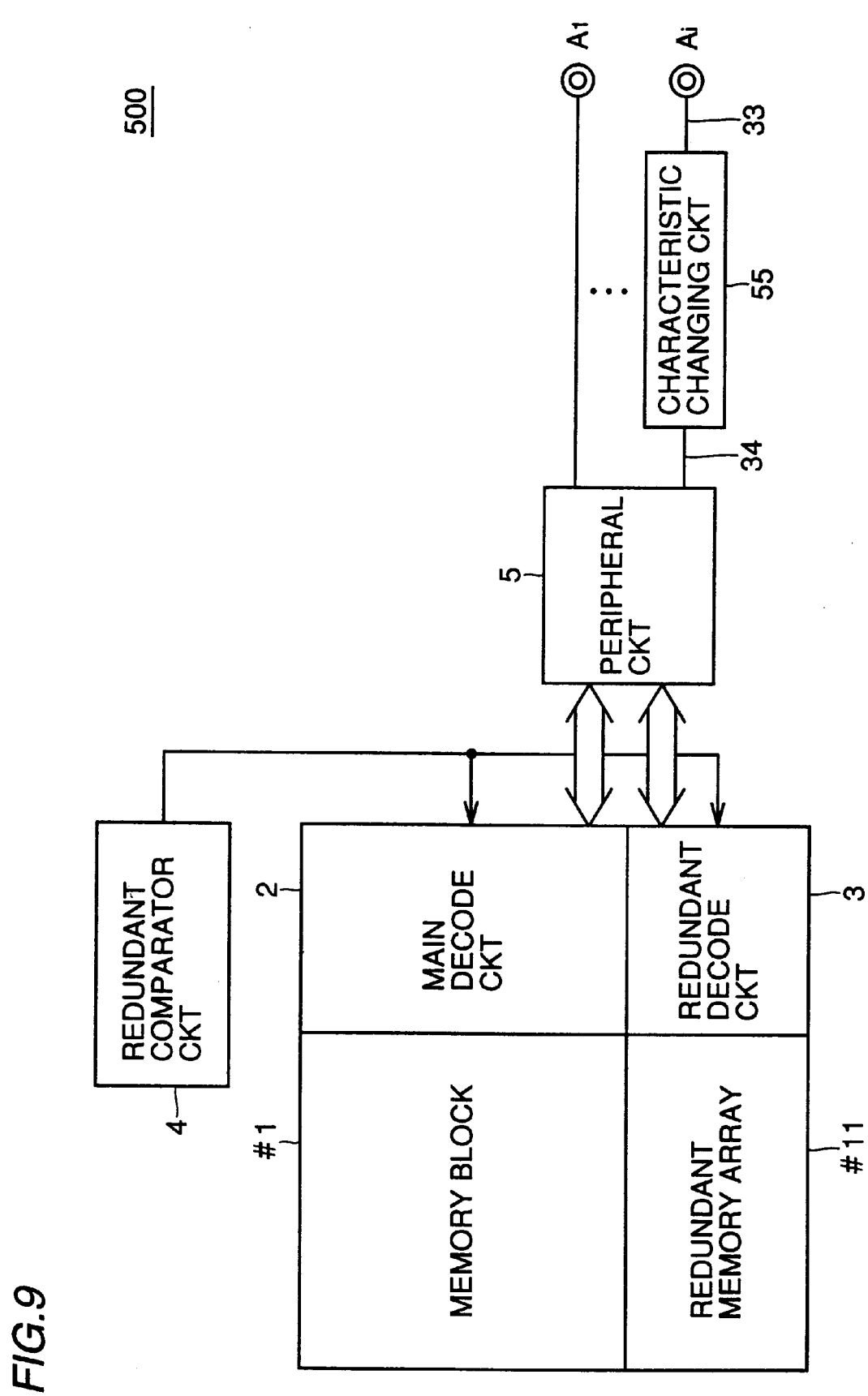
FIG. 9 is a block diagram showing a basic configuration of a semiconductor memory device 500 according to a fifth embodiment of the invention.

Semiconductor memory device 500 shown in FIG. 9 includes a memory block #1, a redundant memory array #11, a main decode circuit 2, a redundant decode circuit 3, a redundant comparator circuit 4, a peripheral circuit 5 and a characteristic changing circuit 55.

Characteristic changing circuit 55 according to the fifth embodiment is connected with any one of external connection terminals (Ai in FIG. 9) by a signal line 33. Characteristic changing circuit 55 is connected with peripheral circuit 5 by a signal line 34.

The configuration of characteristic changing circuit 55 according to the fifth embodiment of the invention will be now described.

Figure 10:
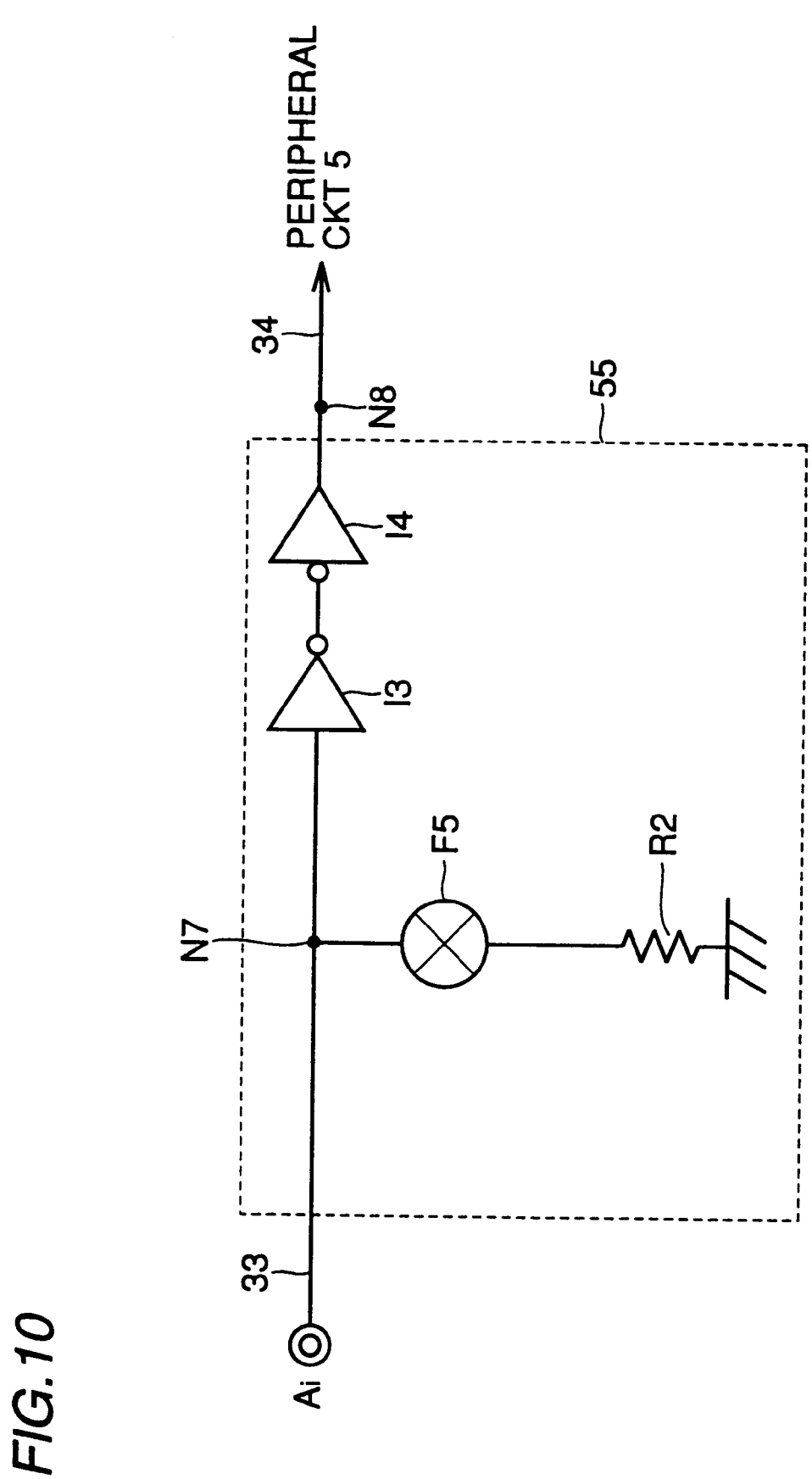
FIG. 10 is a circuit diagram showing the basic configuration of a characteristic changing circuit 55 according to the fifth embodiment.

FIG. 10 is a circuit diagram showing the basic configuration of characteristic changing circuit 55 according to the fifth embodiment. Characteristic changing circuit 55 shown in FIG. 10 includes a fuse F5, a resistor R2, and inverter circuits I3 and I4. Fuse F5 and resistor R2 are connected in series between an input node N7 which is a node connecting signal line 33 and characteristic changing circuit 55 and a ground potential VSS. External connection terminal Ai is connected with signal line 33.

Inverter circuits I3 and I4 are connected in series between node N7 and a node N8 which is a node connecting characteristic changing circuit 55 and signal line 34. Signal line 34 is connected with peripheral circuit 5.

Fuse F5 is a fuse equivalent to the one used for redundant replacement which is not shown and included in redundant comparator circuit 4.

Characteristic changing circuit 55 does not include any NMOS transistor, unlike characteristic changing circuit 54 according to the fourth embodiment (FIG. 8).

The operation of semiconductor memory device 500 according to the fifth embodiment shown in FIGS. 9 and 10 will be now described.

If the fuse blowing is normal, the fuse F5 of characteristic changing circuit 55 is blown together with a fuse (not shown) for redundant replacement, and node N7 and resistor R2 are disconnected. The potential of node N7 therefore does not change by the function of characteristic changing circuit 55. If the fuse blowing is defective, neither the fuse (not shown) for redundant replacement nor fuse F5 is blown. Therefore, node N7 and resistor R2 are electrically connected.

A current I0 (or voltage) is applied from external connection terminal Ai to check changes in the potential and current of external connection terminal Ai.

If the fuse blowing is defective, current I0 is passed across resistor R2 from node N7. The potential of node N7 attains an intermediate potential between the H level and the L level. Thus, a through current is generated in inverter circuits I3 and I4. As a result, the current value (or voltage value) of external connection terminal Ai exceeds a normal value.

If the fuse blowing is normal, the potential of node N7 is at an H level or an L level. A through current is not generated in inverter circuits I3 and I4. The current value (or voltage value) of external connection terminal Ai is within a prescribed range of values.

More specifically, in semiconductor memory device 500 including characteristic changing circuit 55 according to the fifth embodiment, the current value or voltage value measured at the external connection terminal can be changed based on the normality/abnormality of the fuse blowing. As a result, whether or not a fuse has been normally blown can be detected in the molded state.

Semiconductor memory device 500 according to the fifth embodiment of the invention is not limited to the device including a redundant memory array, but also any semiconductor memory device including an internal power supply potential generation circuit which adjusts the internal power supply potential by blowing fuses may be used.

Sixth Embodiment

A semiconductor memory device 600 according to a sixth embodiment of the invention will be now described.

Figure 11:
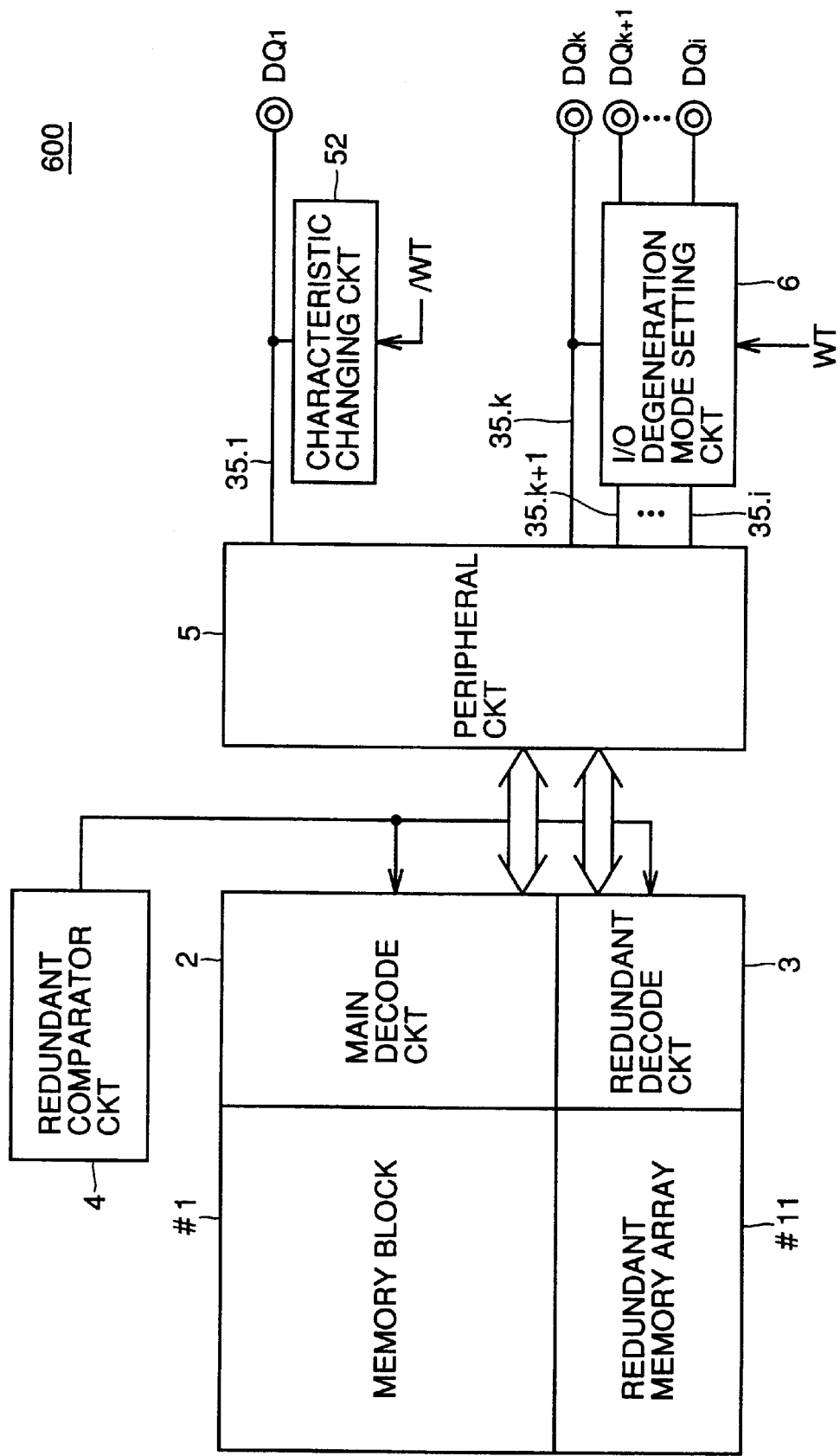
FIG. 11 is a block diagram showing a basic configuration of a semiconductor memory device 600 according to a sixth embodiment of the invention.

Semiconductor memory device 600 shown in FIG. 11 includes a memory block #1, a redundant memory array #11, a main decode circuit 2, a redundant decode circuit 3, a redundant comparator circuit 4, a peripheral circuit 5, an I/O degeneration mode setting circuit 6, and a characteristic changing circuit 52. Semiconductor memory device 600 includes a plurality of data input/output terminals DQ1, ..., DQi. In a normal operation, the plurality of data input/output terminals DQ receive signals from corresponding I/O lines 35.1, ..., 35.i.

Semiconductor memory device 600 further includes an I/O degeneration mode setting circuit 6. I/O degeneration mode setting circuit 6 receives wafer test control signal WT and lets a set of signals from a plurality of I/O lines 35.k, ..., 35.i output from a particular data input/output terminal (DQk in FIG. 11). Thus providing the I/O degeneration mode increases the number to measure in a step of testing a wafer in a device having a large number of I/Os.

Characteristic changing circuit 52 according to the sixth embodiment is the same as characteristic changing circuit 52 according to the second embodiment shown in FIG. 4 and is connected to an I/O line (35.1 in FIG. 11) unused in the I/O degeneration mode.

The operation of semiconductor memory device 600 according to the sixth embodiment shown in FIG. 11 will be now described in conjunction with FIG. 4. In the step of testing a wafer according to the sixth embodiment, an L level wafer test control signal WT to specify a wafer test is externally applied.

The step of testing a wafer when wafer test control signal WT is at an L level will be described.

As described above, the NMOS transistor NT2 of characteristic changing circuit 52 receives, at its gate electrode, the L level wafer test control signal WT and attains a non-conductive state.

The case in which wafer test control signal WT is set to an H level in the molded state will be now described.

If the fuse blowing is normal, the fuse F2 of characteristic changing circuit 52 is blown as well. If therefore a reading operation to semiconductor memory device 600 is performed, the potential of data input/output terminal DQ1 connected with I/O line 35.1 unused in the I/O degeneration mode is at an H level or an L level corresponding to a read out signal.

If the fuse blowing is defective, fuse F2 is not blown. The potential of the I/O line 35.1 unused in the I/O degeneration mode is fixed at an H level by external power supply voltage VCC.

More specifically, in semiconductor memory device 600 including characteristic changing circuit 52 according to the sixth embodiment, electrical characteristics of I/O line unused in the I/O degeneration mode may be changed based on the normality/abnormality of the fuse blowing. Since the change in electrical characteristics may be monitored through a data input/output terminal, whether or not a fuse has been normally blown may be detected in the molded state.

In addition, according to the sixth embodiment, electrical characteristics of the I/O line unused in the I/O degeneration mode is changed, and therefore the number of devices to measure at a time is not limited.

Semiconductor memory device 600 according to the sixth embodiment is not limited to the device including a redundant memory array, but any semiconductor memory device including an internal power supply potential generation circuit which adjusts the internal power supply potential by blowing fuses may be used.

Characteristic changing circuit 52 may be connected with any I/O line, which is unused in the I/O degeneration mode.

In place of characteristic changing circuit 52, characteristic changing circuit 53 according to the third embodiment (FIG. 6) may be used.

In that case, if the fuse blowing is defective, the potential of I/O line 35.1 unused in the I/O degeneration mode is fixed at an L level by ground potential VSS.

Seventh Embodiment

A semiconductor memory device 700 according to a seventh embodiment of the invention will be now described.

Figure 12:
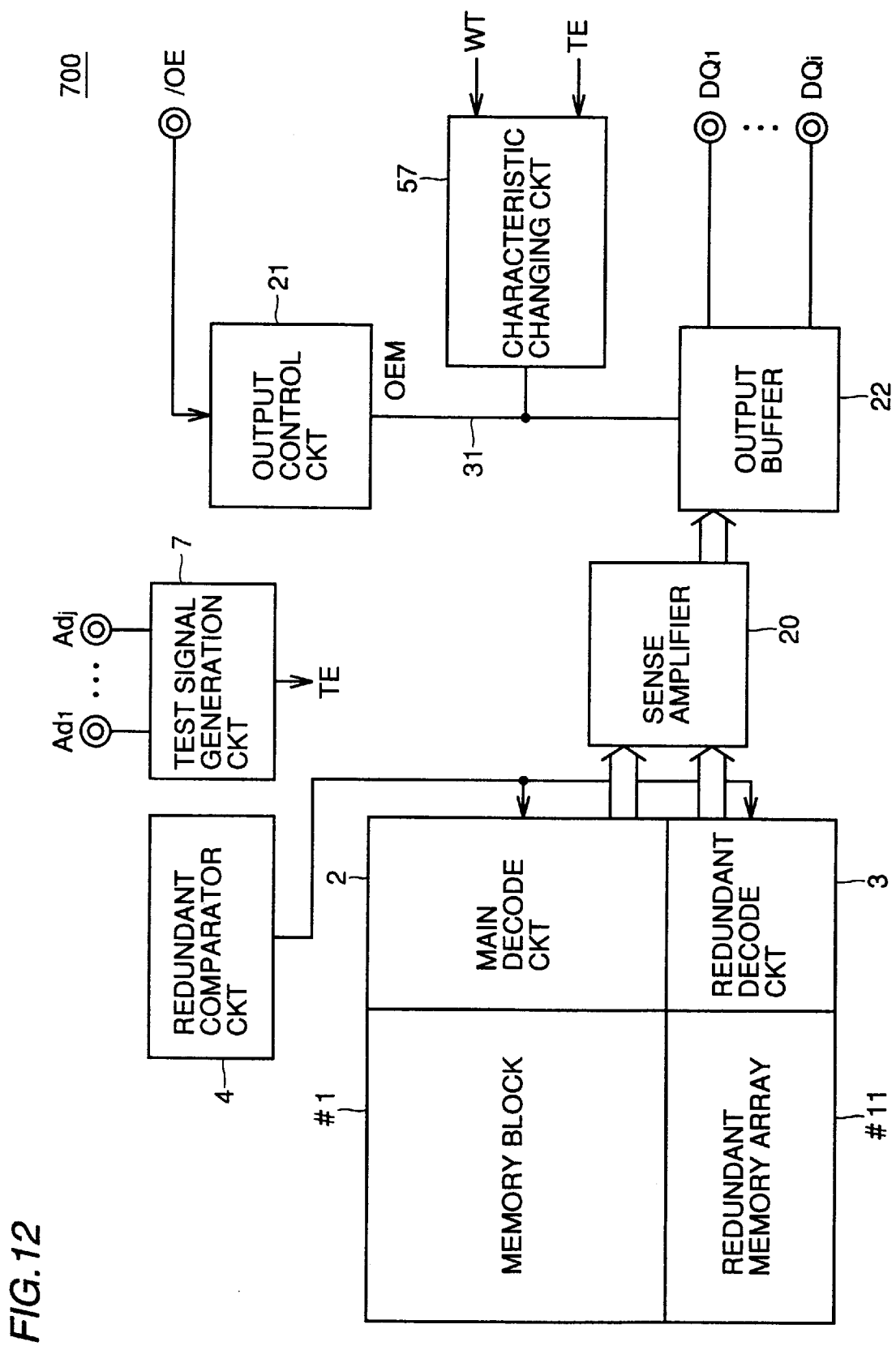
FIG. 12 is a circuit diagram showing a basic configuration of a semiconductor memory device 700 according to a seventh embodiment of the invention.

Semiconductor memory device 700 shown in FIG. 12 includes a memory block #1, a redundant memory array #11, a main decode circuit 2, a redundant decode circuit 3, a redundant comparator circuit 4, a sense amplifier 20, an output control circuit 21, an output buffer 22, a test signal generation circuit 7, and a characteristic changing circuit 57.

Test signal generation circuit 7 generates a test signal TE according to an address signal received from address terminals Ad1, . . . , Adj.

Characteristic changing circuit 57 according to the seventh embodiment is connected with a signal line 31 connecting output control circuit 21 and output buffer 22.

The configuration of characteristic changing circuit 57 according to the seventh embodiment will be now described.

Figure 13:
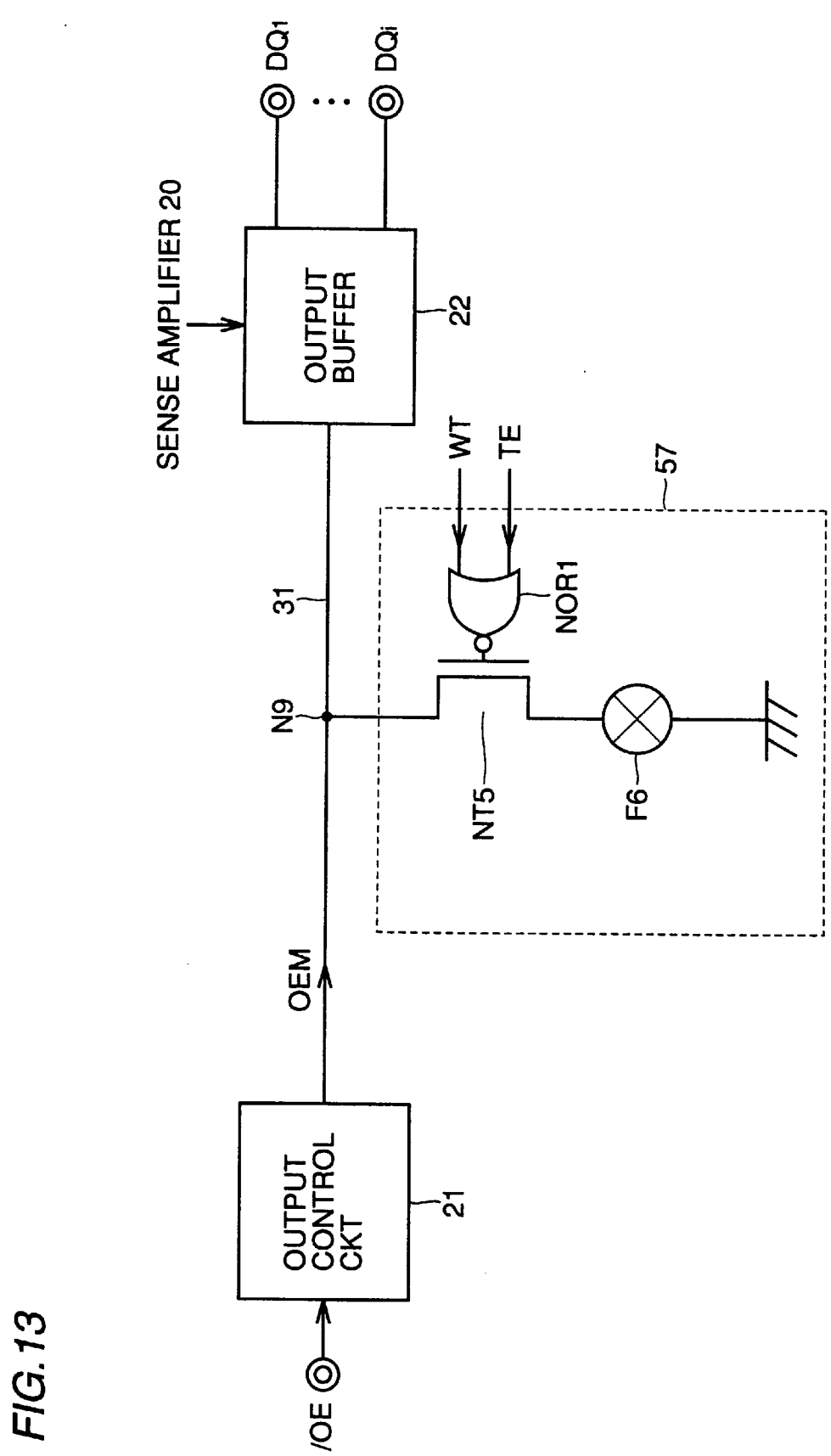
FIG. 13 is a circuit diagram showing the basic configuration of a characteristic changing circuit 57 according to the seventh embodiment.

FIG. 13 is a circuit diagram showing the basic configuration of characteristic changing circuit 57 according to the seventh embodiment, together with the connection between output control circuit 21 and output buffer 22.

Characteristic changing circuit 57 shown in FIG. 13 includes a fuse F6, an NMOS transistor NT5, and an NOR circuit NOR1. Fuse F6 and NMOS transistor NT5 are connected in series between a node N9 and the ground potential. Node N9 is connected at a point on signal line 31 transmitting an output control signal OEM.

The gate electrode of NMOS transistor NT5 receives the output of NOR circuit NOR1. NOR circuit NOR1 receives a test signal TE and a wafer test control signal WT at its input.

If wafer test control signal WT or test signal TE is at an H level, NMOS transistor NT5 attains a non-conductive state.

Fuse F6 is a fuse equivalent to the one used for redundant replacement (not shown) included in redundant comparator circuit 4.

The operation of semiconductor memory device 700 according to the seventh embodiment shown in FIGS. 12 and 13 will be now described. In the step of testing a wafer according to the seventh embodiment, an H level wafer test control signal WT to specify a wafer test is externally applied.

The step of testing a wafer when wafer test control signal WT is at an H level will be described.

NMOS transistor NT5 attains a non-conductive state in this case. The potential of signal line 31 does not change by the function of characteristic changing circuit 57.

The case in which wafer test control signal WT is set to an L level in the molded state will be now described.

If the fuse blowing is normal, fuse F6 in characteristic changing circuit 57 is blown together with fuse (not shown) for redundant replacement, and ground potential VSS and node N9 are disconnected. Therefore, the potential of signal line 31 does not change by the function of characteristic changing circuit 57, and output buffer 22 receives output control signal OEM directly from output control circuit 21.

As a result, if a reading operation to semiconductor memory device 700 is performed, the potential of data input/output terminal DQi attains an H level or an L level in response to a read out signal.

If the fuse blowing is abnormal, the fuse (not shown) for redundant replacement and fuse F6 are not blown. Herein, NMOS transistor NT5 conducts in response to test signal TE at an L level. The conduction of NMOS transistor NT5 connects ground potential VSS and node N9, and output control signal OEM at an L level is transmitted to output buffer 22 through signal line 31. Therefore, in response to the level of test signal TE, data input/output terminal DQi may be brought into a high impedance state.

More specifically, in semiconductor memory device 700 including characteristic changing circuit 57 according to the seventh embodiment, electrical characteristics of the chip may be changed based on the normality/abnormality of the fuse blowing in response to the test signal. The change in electrical characteristics may be monitored through the data input/output terminal. As a result, whether or not a fuse has been normally blown may be detected in the molded state.

Semiconductor memory device 700 according to the seventh embodiment is not limited to the device including a redundant memory array, but any semiconductor memory device including an internal power supply potential generation circuit which adjust the internal power supply potential by blowing fuses may be used.

Eighth Embodiment

A semiconductor memory device 800 according to an eighth embodiment of the invention will be now described.

Figure 14:
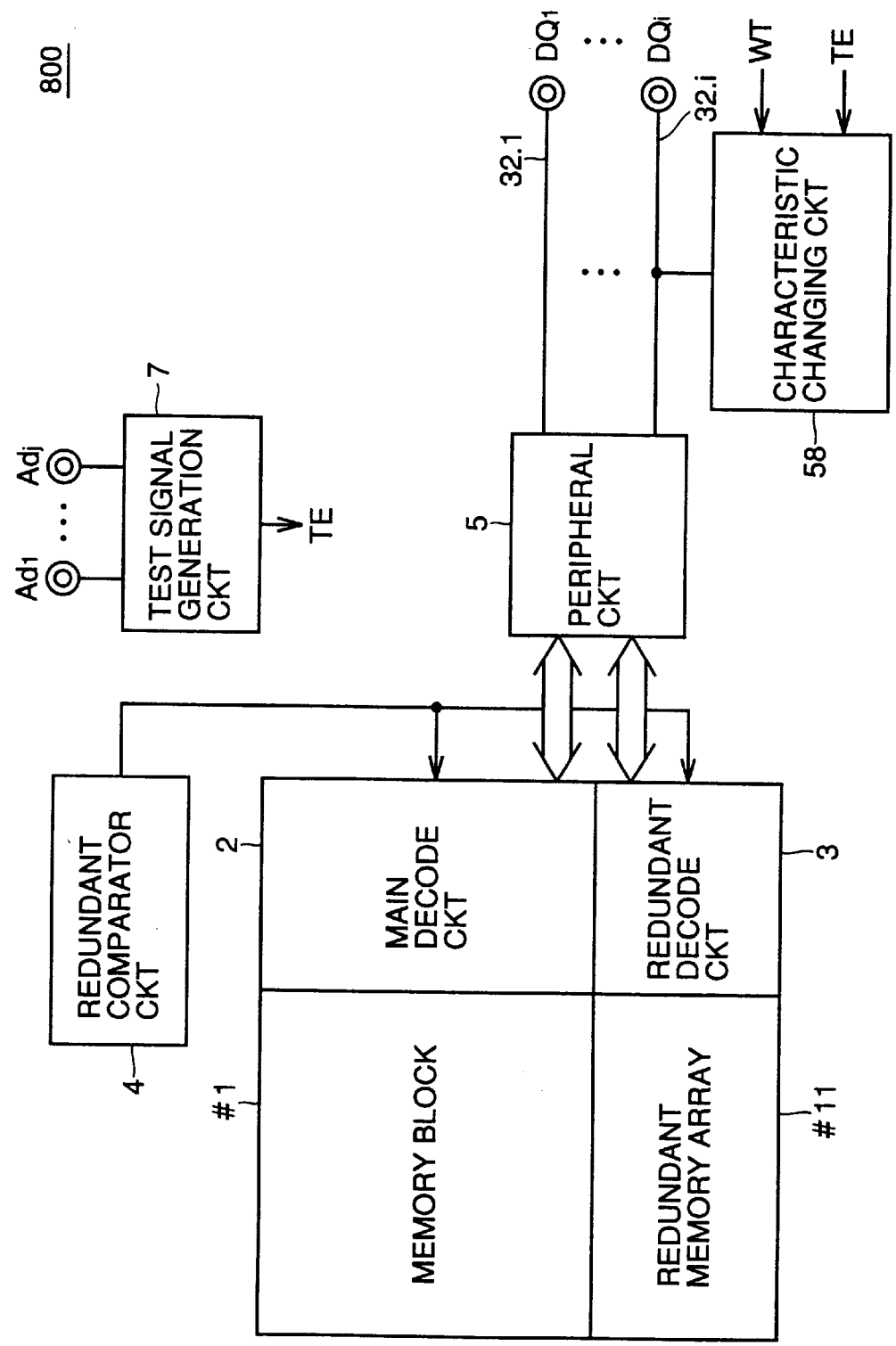
FIG. 14 is a block diagram showing a basic configuration of a semiconductor memory device 800 according to an eighth embodiment of the invention.

Semiconductor memory device 800 shown in FIG. 14 includes a memory block #1, a redundant memory array #11, a main decode circuit 2, a redundant decode circuit 3, a redundant comparator circuit 4, a peripheral circuit 5, a test signal generation circuit 7 and a characteristic changing circuit 58.

A signal read out from memory block #1 or redundant memory array #11 is output to a corresponding one of data input/output terminals DQ1, . . . , DQi through a corresponding one of I/O lines 32.1, . . . , 32.i.

Characteristic changing circuit 58 according to the eighth embodiment is connected with I/O line 32.i which is connected with data input/output terminal DQi.

The configuration of characteristic changing circuit 58 according to the eighth embodiment will be described.

Figure 15:
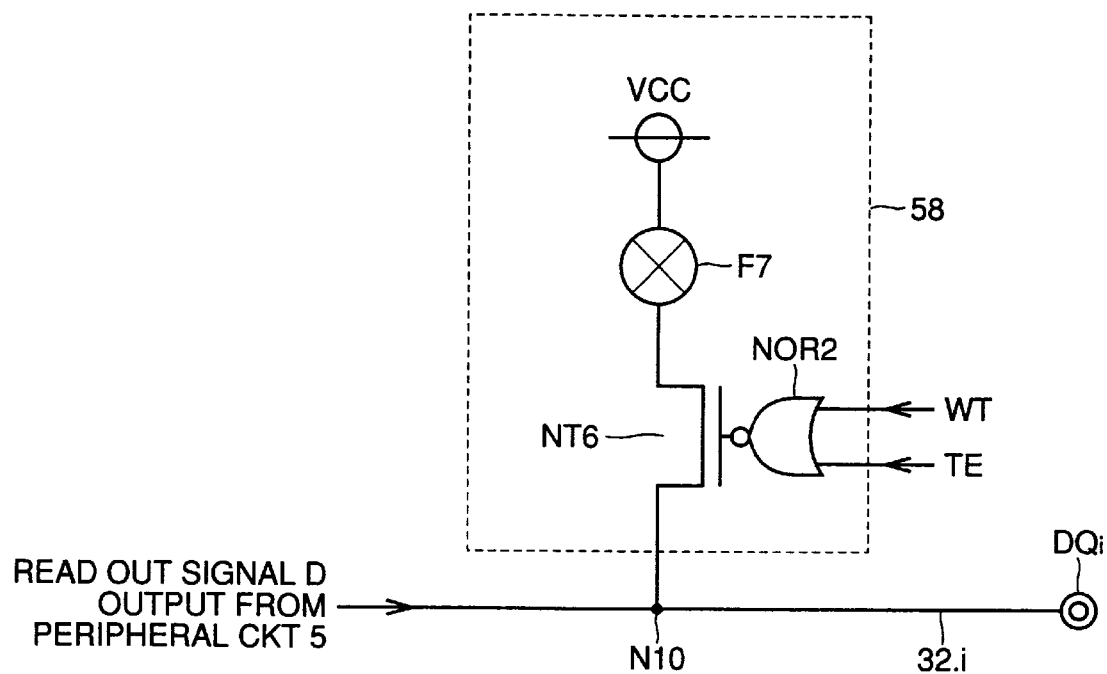
FIG. 15 is a circuit diagram showing the basic configuration of a characteristic changing circuit 58 according to the eighth embodiment.

Characteristic changing circuit 58 shown in FIG. 15 includes a fuse F7, an NMOS transistor NT6, and an NOR circuit NOR2. Fuse F7 and NMOS transistor NT6 are connected in series between a node N10 which is a connection node with I/O line 32.i and an external power supply potential VCC.

Fuse 7 is a fuse equivalent to the one used for redundant replacement (not shown) as included in redundant comparator circuit 4. The gate electrode of NMOS transistor NT6 receives the output of NOR circuit NOR2. NOR circuit NOR2 receives a test signal TE and a wafer test control signal WT at its input.

Herein, if wafer test control signal WT or test signal TE is at an H level, NMOS transistor NT6 attains a non-conductive state.

The operation of semiconductor memory device 800 according to the eighth embodiment shown in FIGS. 14 and 15 will be described. In the step of testing a wafer according to the eighth embodiment, wafer test control signal WT at an H level to specify a wafer test is externally applied.

When the step of testing a wafer with H level wafer test control signal WT will be described.

NMOS transistor NT6 attains a non-conductive state. The potential of I/O line 32.i does not change by the function of characteristic changing circuit 58.

The operation with wafer test control signal WT at an L level will be now described.

If the fuse blowing is normal, fuse F7 in characteristic changing circuit 58 is blown together with the fuse (not shown) for redundant replacement, and external power supply potential VCC and node N10 are disconnected. The potential of I/O line 32.i does not change by the function of characteristic changing circuit 58.

As a result, if a reading operation to semiconductor memory device 800 is performed, the potential of data input/output terminal DQi attains an H level or an L level in response to a read out signal D.

If the fuse blowing is defective, the fuse (not shown) for redundant replacement and fuse F7 are not blown. NMOS transistor NT6 conducts in response to test signal TE at an L level. As NMOS transistor NT6 conducts, external power supply potential VCC and node N10 are connected, and the potential of I/O line 32.i is fixed at an H level by external power supply voltage VCC. As a result, based on the level of test signal TE, data input/output terminal DQi is always at an H level.

In semiconductor memory device 800 including characteristic changing circuit 58 according to the eighth embodiment, an output signal from a data input/output terminal may be changed based on the normality/abnormality of the fuse blowing in response to a test signal. As a result, whether or not a fuse has been normally blown may be detected in the molded state.

Semiconductor memory device 800 according to the eighth embodiment is not limited to the device including a redundant memory array, but any semiconductor memory device including an internal power supply potential generation circuit which adjusts the internal power supply potential by blowing a fuse may be used.

Characteristic changing circuit 58 may be connected with an I/O line 32 connected with any of data input/output terminals other than data input/output terminal DQi.

In addition, in semiconductor memory device 600 according to the sixth embodiment, a test signal generation circuit 7 is additionally provided and a characteristic changing circuit 58 may be used in place of characteristic changing circuit 52, so that whether or not a fuse has been blown may be detected using a data input/output terminal unused in the I/O degeneration mode in response to a test signal.

Ninth Embodiment

A semiconductor memory device 900 according to a ninth embodiment of the invention will be now described.

Figure 16:
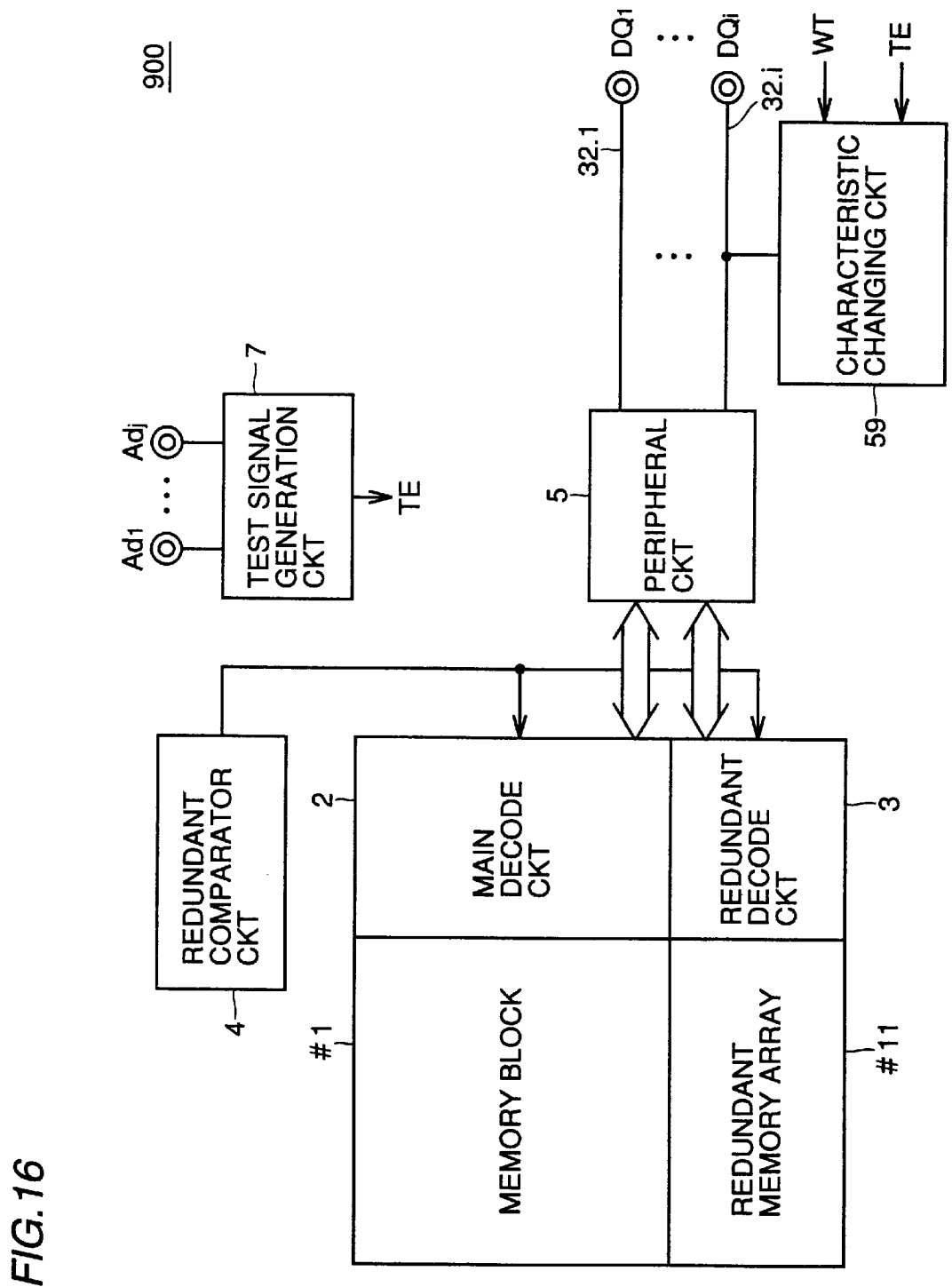
FIG. 16 is a block diagram showing a basic configuration of a semiconductor memory device 900 according to a ninth embodiment of the invention.

Semiconductor memory device 900 shown in FIG. 16 includes a memory block #1, a redundant memory array #11, a main decode circuit 2, a redundant decode circuit 3, a redundant comparator circuit 4, a peripheral circuit 5, a test signal generation circuit 7 and a characteristic changing circuit 59.

A signal read out from memory block #1 or redundant memory array #11 is output onto a corresponding one of data input/output terminals DQ1, . . . , DQi through a corresponding one of I/O lines 32.1, . . . , 32.i.

Characteristic changing circuit 59 according to the ninth embodiment is connected with I/O line 32.i in connection with data input/output terminal DQi.

The configuration of characteristic changing circuit 59 according to the ninth embodiment will be described.

Figure 17:
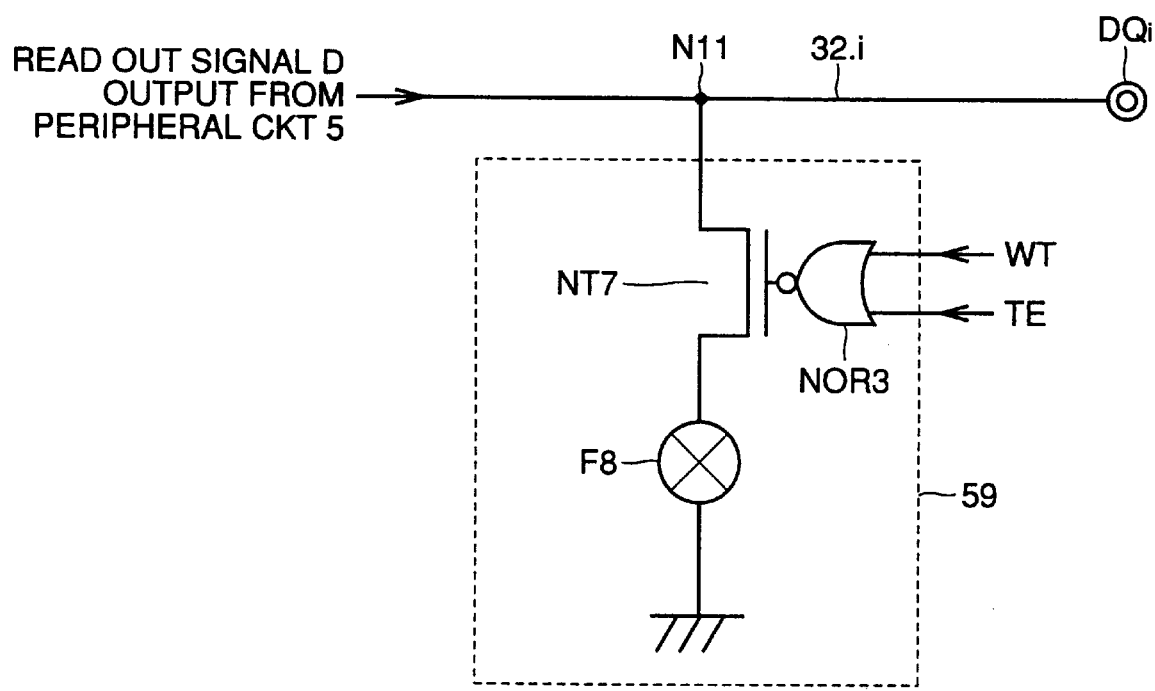
FIG. 17 is a circuit diagram showing the basic configuration of a characteristic changing circuit 59 according to the ninth embodiment.

Characteristic changing circuit 59 shown in FIG. 17 includes a fuse F8, an NMOS transistor NT7, and an NOR circuit NOR3. Fuse F8 and NMOS transistor NT7 are connected in series between a node N11 which is a connection node with I/O line 32.i and a ground potential VSS.

Fuse F8 is a fuse equivalent to the one used for redundant replacement (not shown) as included in redundant comparator circuit 4. The gate electrode of NMOS transistor NT7 receives the output of NOR circuit NOR3. NOR circuit NOR3 receives a test signal TE and a wafer test control signal WT at its input.

If wafer test control signal WT or test signal TE is at an H level, NMOS transistor NT7 attains a non-conductive state.

The operation of semiconductor memory device 900 according to the ninth embodiment shown in FIGS. 16 and 17 will be now described. In the step of testing a wafer according to the ninth embodiment, wafer test control signal WT at an H level to specify a wafer test is externally applied.

The step of wafer test with wafer test control signal WT at an H level will be described.

NMOS transistor NT7 attains a non-conductive state. The potential of I/O line 32.i does not change by the function of characteristic changing circuit 59.

The operation with wafer test control signal WT at an L level in the molded state will be now described.

If the fuse blowing is normal, the fuse (not shown) for redundant replacement and fuse F8 in characteristic changing circuit 59 are blown, and ground potential VSS and node N11 are disconnected. As a result, the potential of node N11 does not change by the function of characteristic changing circuit 59.

As a result, if a reading operation to semiconductor memory device 900 is performed, the potential of data input/output terminal DQi attains an H level or an L level in response to a read out signal D.

If the fuse blowing is not normal, neither the fuse (not shown) for redundant replacement nor fuse F8 are blown. NMOS transistor NT7 conducts in response to test signal TE at an L level. The conduction of NMOS transistor NT7 connects ground potential VSS and node N11, and the potential of I/O line 32.i is fixed at an L level by ground potential VSS. Based on the level of test signal TE, data input/output terminal DQi is always at an L level.

More specifically, in semiconductor memory device 900 including characteristic changing circuit 59 according to the ninth embodiment, an output signal from a data input/output terminal may be changed based on the normality/abnormality of the fuse blowing. Whether or not a fuse has been normally blown may be detected in the molded state.

Semiconductor memory device 900 according to the ninth embodiment is not limited to the device including a redundant array, but any semiconductor memory device including an internal power supply potential generation circuit which adjusts the internal power supply potential by blowing fuses my be used.

Characteristic changing circuit 59 may be connected with an I/O line 32 connected with any of data input/output terminals other than data input/output terminal DQi.

Tenth Embodiment

A semiconductor memory device 1000 according to a tenth embodiment of the invention will be now described.

Figure 18:
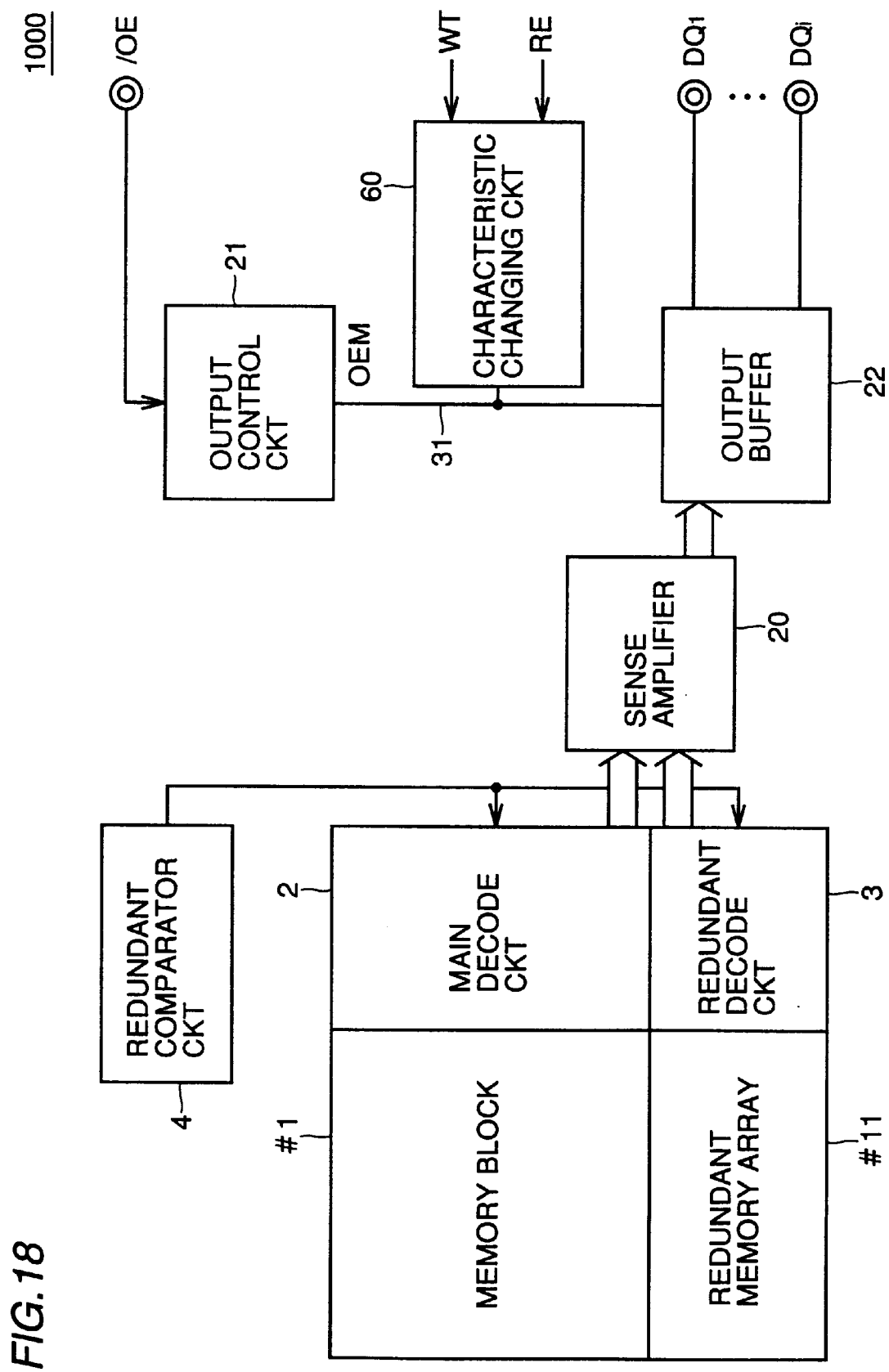
FIG. 18 is a block diagram showing a basic configuration of a semiconductor memory device 1000 according to a tenth embodiment of the invention.

Semiconductor memory device 1000 shown in FIG. 18 includes a memory block #1, a redundant memory array #11, a main decode circuit 2, a redundant decode circuit 3, a sense amplifier 20, an output control circuit 21, an output buffer 22 and a characteristic changing circuit 60.

Characteristic changing circuit 60 according to the tenth embodiment of the invention is connected with a signal line 31 connecting output control circuit 21 and output buffer 22.

The configuration of characteristic changing circuit 60 according to the tenth embodiment will be now described.

Figure 19:
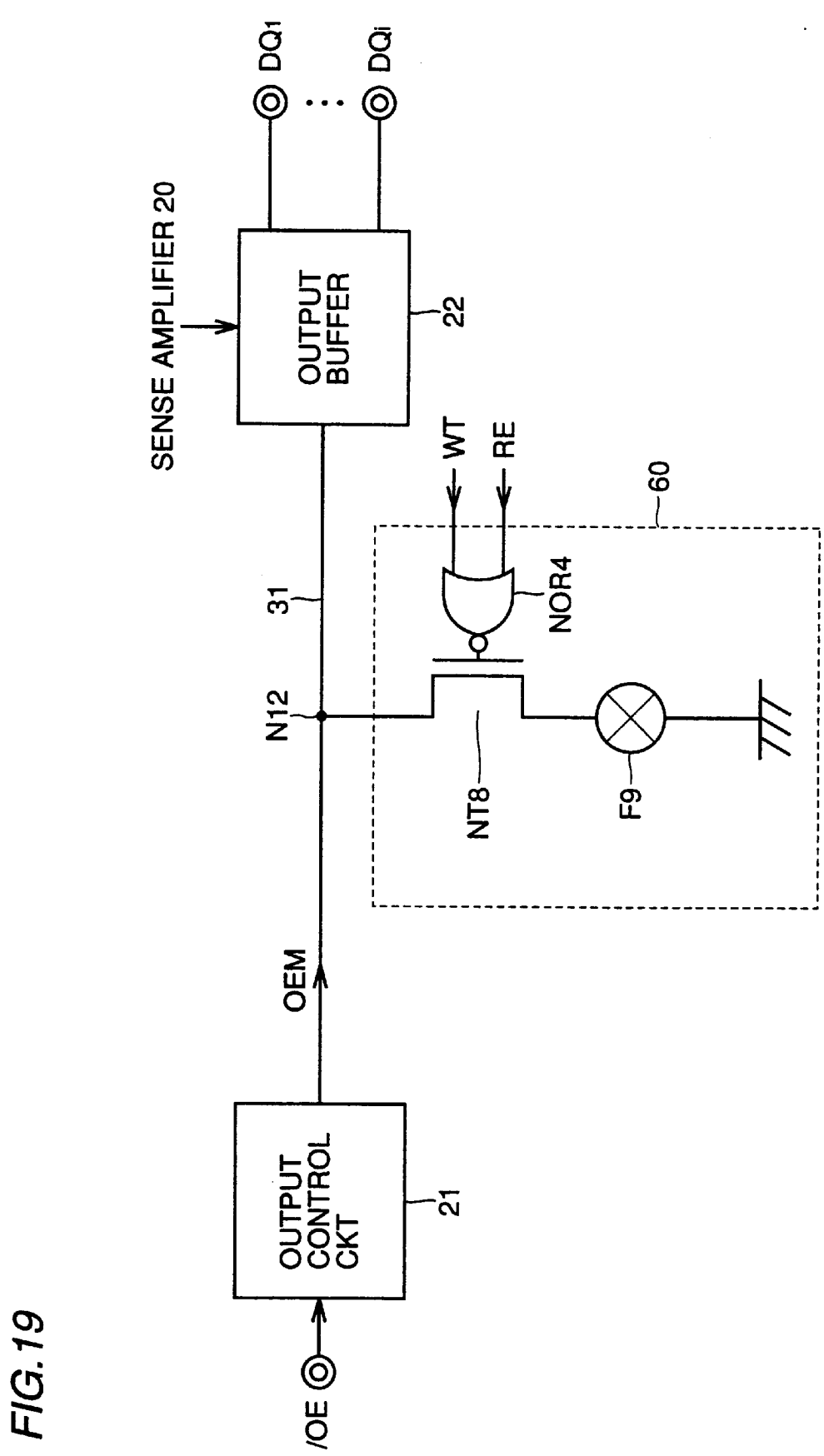
FIG. 19 is a circuit diagram showing the basic configuration of a characteristic changing circuit 60 according to the tenth embodiment.
Figure 20:
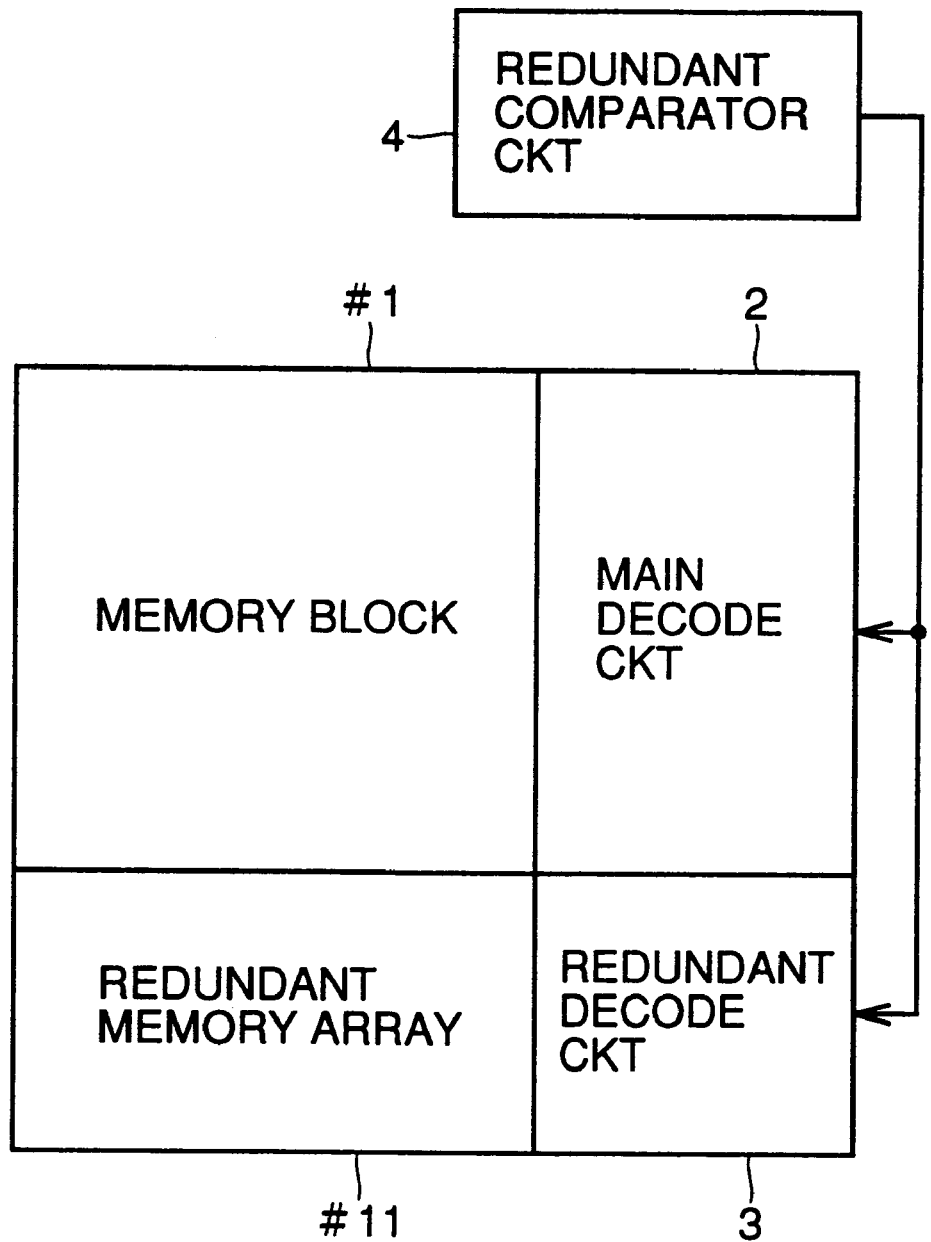
FIG. 20 is a block diagram showing a basic configuration of a conventional semiconductor memory device 2000.

Characteristic changing circuit 60 shown in FIG. 19 includes a fuse F9, an NMOS transistor NT8 and an NOR circuit NOR4. Fuse F9 and NMOS transistor NT8 are connected in series between a node N12 and the ground potential. Node N12 is connected at a point on signal line 31 transmitting an output control signal OEM.

The gate electrode of NMOS transistor NT8 receives the output of NOR circuit NOR4. NOR circuit NOR4 receives a repair enable signal RE and a wafer test control signal WT at its input.

Repair enable signal RE is a determination signal used to determine whether or not a chip should have a fuse blown for replacing a defective memory cell or adjusting its internal power supply potential, and the signal is an at L level for a chip which needs blowing of a fuse and at an H level otherwise.

If wafer test control signal WT or repair enable signal RE is at an H level, NMOS transistor NT8 attains a non-conductive state.

Fuse F9 is a fuse equivalent to the one used for redundant replacement (not shown) as included in redundant comparator circuit 4.

The operation of semiconductor memory device 100 according to the tenth embodiment shown in FIGS. 18 and 19 will be now described. In the step of testing a wafer according to the tenth embodiment, wafer test control signal WT at an H level to specify a wafer test is externally applied.

The step of testing a wafer with H level wafer test control signal WT will be described.

The NMOS transistor NT8 of characteristic changing circuit 60 receives H level wafer test control signal WT at its gate electrode and attains a non-conductive state. The potential of signal line 31 does not change by the function of characteristic changing circuit 60.

The operation with wafer test control signal WT at an L level in the molded state will be now described.

If the fuse blowing is normal, the fuse (not shown) for redundant replacement and fuse F9 in characteristic changing circuit 60 are blown. Ground potential VSS and node N12 are disconnected. The potential of signal line 31 therefore does not change by the function of characteristic changing circuit 60. Output buffer 22 receives an output control signal OEM directly from output control circuit 21.

As a result, if a reading operation to semiconductor memory device 1000 is performed, the potential of data input/output terminal DQi attains an H level or an L level in response to a read out signal D.

If the fuse blowing is abnormal, neither the fuse (not shown) for redundant replacement nor fuse F9 is blown. NMOS transistor NT8 conducts in response to repair enable signal RE at an L level. The conduction of NMOS transistor NT8 connects ground potential VSS and node N12, and output control signal OEM at an L level is transmitted to output buffer 22 through signal line 31. Therefore, based on the level of repair enable signal RE, data input/output terminal DQi may be brought into a high impedance state.

More specifically, in semiconductor memory device 1000 including characteristic changing circuit 60 according to the tenth embodiment, electrical characteristics of the chip may be changed based on the normality/abnormality of the fuse blowing only when fuses are blown. Furthermore, the change in electrical characteristics may be monitored through a data input/output terminal. As a result, whether or not a fuse has been normally blown may be detected in the molded state.

Note that if the blowing of a fuse is not necessary, NMOS transistor NT8 attains a non-conductive state. If therefore a reading operation to semiconductor memory device 1000 is performed, the potential of data input/output terminal DQi attains an H level or an L level in response to a read out signal.

Semiconductor memory device 1000 according to the tenth embodiment is not limited to the device including a redundant memory array, but any semiconductor memory device including an internal power supply potential generation circuit which adjusts the internal power supply potential by blowing fuses may be used.

In the semiconductor memory device according to the invention, since electrical characteristics of the chip may be changed based on the normality/abnormality of the fuse blowing, whether or not a fuse has been normally blown may be detected in the molded state of the device.

In the semiconductor memory device according to the invention, the potential of a data input/output terminal can be fixed based on the normality/abnormality of the fuse blowing.

In the semiconductor memory device according to the invention, the potential of a data input/output terminal unused in the I/O degeneration mode may be changed based on the normality/abnormality of the fuse blowing.

In the semiconductor memory device according to the invention, the current or voltage value at the external connection terminal may be set to a value other than a specified value based on the normality/abnormality of the fuse blowing.

In the semiconductor memory device according to the invention, electrical characteristics of the chip may be changed based on the normality/abnormality of the fuse blowing only if a particular signal is input.

In the semiconductor memory device according to the invention, whether or not a fuse has been normally blown may be detected in the molded state since the potential of a data output terminal may be brought into a high impedance state based on the normality/abnormality of the fuse blowing.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a circuit having a first fuse to be blown to perform a predetermined function,
   an external connection terminal;
   a first signal line for transmitting a signal received from said external connection terminal or transmitting a signal to said external connection terminal; and
   means for changing an electrical characteristic of said first signal line based on the normality/abnormality of the blowing of said first fuse.

2. The semiconductor memory device as recited in claim 1, wherein said means for changing the electrical characteristic includes a second fuse equivalent to said first fuse, said second fuse being provided between said first signal line and a power supply potential.

3. The semiconductor memory device as recited in claim 1, wherein said means for changing the electrical characteristic includes,
a second signal line connecting said external connection terminal and said first signal line,
means connected between said second signal line and said first signal line for passing different consumption current based on the potential of said second signal line,
a resistor having its one terminal connected to a ground potential; and
a third fuse provided between said resistor and said second signal line and being equivalent to said first fuse.

4. The semiconductor memory device as recited in claim 2, further comprising first switch means responsive to an externally applied control signal for connecting/disconnecting said first signal line and said second fuse.

5. The semiconductor memory device as recited in claim 2, further comprising:

test signal generation means responsive to an externally applied address signal for generating a test signal; and
second switch means responsive to said test signal and an externally applied control signal for connecting/disconnecting said first signal line and said second fuse.

6. The semiconductor memory device as recited in claim 2, wherein said external connection terminal is a data input/output terminal.

7. The semiconductor memory device as recited in claim 2, wherein said external connection terminal is a data input/output terminal unused in an I/O degeneration mode.

8. The semiconductor memory device as recited in claim 3, further comprising third switch means responsive to an externally applied control signal for connecting/disconnecting said second signal line and said third fuse.

9. The semiconductor memory device as recited in claim 3, further comprising:

test signal generation means responsive to an externally applied address signal for generating a test signal; and
fourth switch means for responsive to said test signal and an externally applied control signal for connecting/disconnecting said second signal line and said third fuse.

10. The semiconductor memory device as recited in claim 3, wherein said means for passing different consumption current based on the potential of said second signal line is a plurality of inverter circuits.

11. A semiconductor memory device comprising:

a circuit having a first fuse to be blown to perform a predetermined function,
output control signal generation means for generating an output control signal to externally output a signal read out from a memory array;
a first signal line for transmitting said output control signal; and
means for changing an electrical characteristic of said first signal line based on the normality/abnormality of the blowing of said first fuse.

12. The semiconductor memory device as recited in claim 11, wherein said means for changing an electrical characteristic includes a second fuse equivalent to said first fuse,
said second fuse being provided between said first signal line and a power supply potential.

13. The semiconductor memory device as recited in claim 12, further comprising first switch means responsive to an externally applied control signal for connecting/disconnecting said first signal line and said second fuse.

14. The semiconductor memory device as recited in claim 12, further comprising:

test signal generation means responsive to an externally applied address signal for generating a test signal; and
second switch means responsive to said test signal and an externally applied control signal for connecting/disconnecting said first signal line and said second fuse.

15. The semiconductor memory device as recited in claim 12, further comprising third switch means responsive to an externally applied control signal for connecting/disconnecting said first signal line and said second fuse only if the first fuse should be blown.

* * * * *